(12) United States Patent
Saeki et al.

(10) Patent No.: US 6,229,955 B1
(45) Date of Patent: *May 8, 2001

(54) OPTICAL DISC, RECORDING APPARATUS, AND COMPUTER-READABLE RECORDING MEDIUM

(75) Inventors: Shinichi Saeki, Sennan-gun; Kaoru Murase, Ikoma-gun; Tomoyuki Okada, Katano; Kazuhiro Tsuga, Takarazuka; Tokuo Nakatani, Ibaraki, all of (JP)

(73) Assignee: Matsushita Electric Industrial Co., Ltd., Osaka-Fu (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/502,779

(22) Filed: Feb. 11, 2000

Related U.S. Application Data

(62) Division of application No. 09/154,896, filed on Sep. 17, 1998, now Pat. No. 6,078,727.

(30) Foreign Application Priority Data

Sep. 17, 1997 (JP) .................................................. 9-251993
Sep. 17, 1997 (JP) .................................................. 9-252000
Sep. 4, 1998 (JP) ................................................. 10-251068

(51) Int. Cl.$^7$ ........................... H04N 5/781; H04N 5/917
(52) U.S. Cl. ........................................... 386/125; 386/126
(58) Field of Search .................................. 386/125, 124, 386/126, 109, 111, 112, 105, 106, 27, 33, 83, 40, 34, 66, 1; 360/32; H04N 5/781, 5/917

(56) References Cited

U.S. PATENT DOCUMENTS

| | | |
|---|---|---|
| 4,777,537 | 10/1988 | Ueno et al. . |
| 5,552,896 | 9/1996 | Yoshida . |
| 5,617,407 | 4/1997 | Bareis . |
| 5,642,338 | 6/1997 | Fukushima et al. . |
| 6,087,727 * | 6/2000 | Saeki et al. ........................ 386/125 |

FOREIGN PATENT DOCUMENTS

| | | |
|---|---|---|
| 0695098A2 | 1/1996 | (EP) . |
| 0724264A2 | 7/1996 | (EP) . |
| 0729153A2 | 8/1996 | (EP) . |
| 0752705A2 | 1/1997 | (EP) . |
| 0797204A2 | 9/1997 | (EP) . |

\* cited by examiner

*Primary Examiner*—Robert Chevalier
(74) *Attorney, Agent, or Firm*—Wenderoth, Lind & Ponack, L.L.P.

(57) ABSTRACT

An optical disc including: a data area storing one or more video objects; and a time map area storing time map information. Each video object includes a plurality of video object units. The time map information includes a first time table and a second time table for each video object. Each first time table includes: addresses of video object units in a corresponding video object; and indicators. The addresses are arranged in order and indicate storage positions of the video object units that correspond to reproduction points that differ by a predetermined time unit. The predetermined time unit is longer than a maximum reproduction period of a video object unit. The indicators specify the video object units which respectively correspond to the addresses. Each second time table includes an entry for each video object unit in the corresponding video object. The entries are arranged in order. Each second time table includes a reproduction period and a data size of each video object unit.

16 Claims, 28 Drawing Sheets

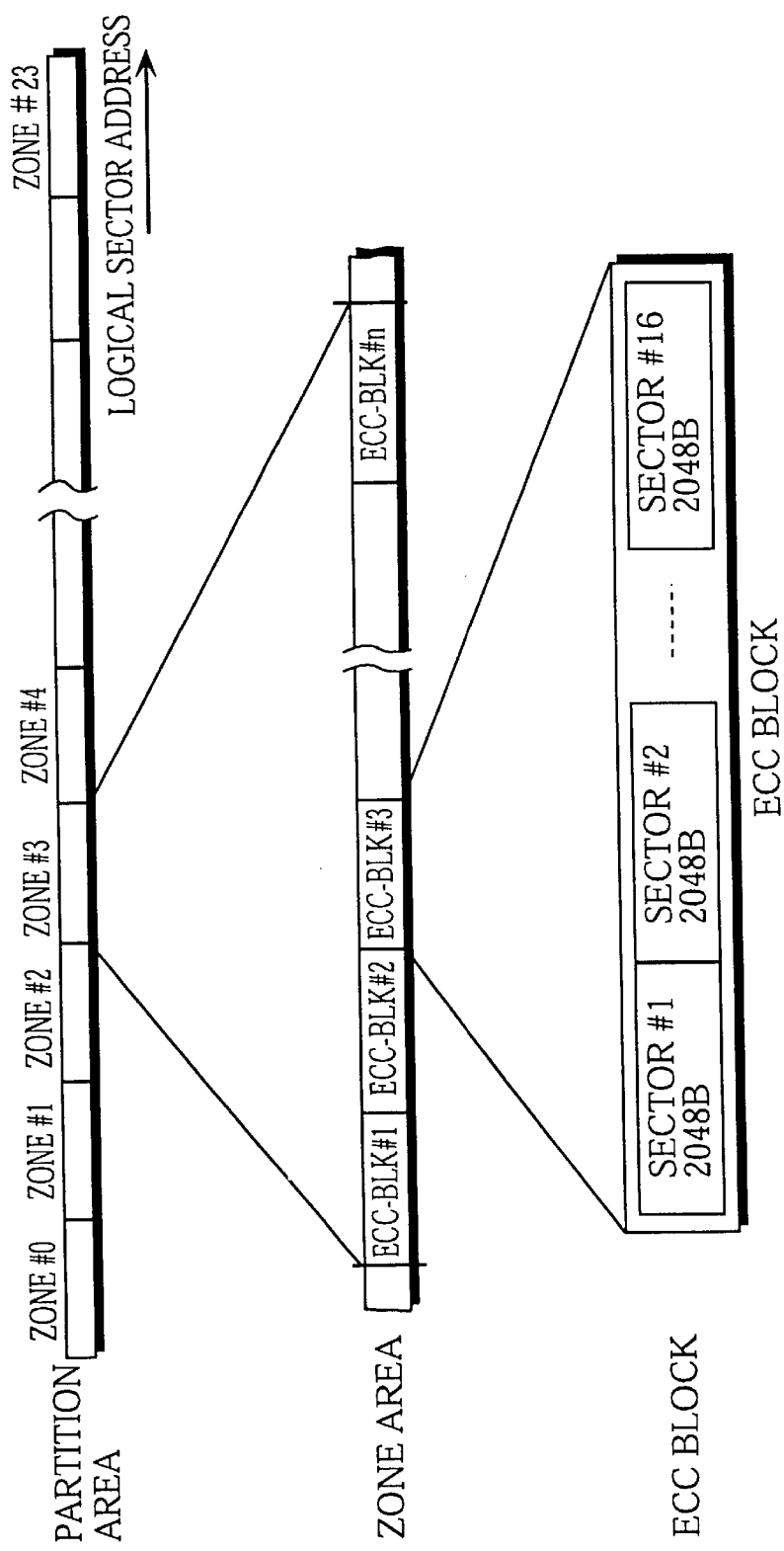

FIG. 20

| COMMON FILE SYSTEM UNIT 104 | |
|---|---|
| CREATE | GENERATE A FILE |
| DELETE | DELETE A FILE |
| OPEN | OPEN A FILE |
| CLOSE | CLOSE A FILE |
| WRITE | WRITE A NON-AV FILE |
| READ | READ A FILE (COMMON TO AV AND NON-AV) |
| SEEK | MOVE INSIDE A DATA STREAM |
| RENAME | CHANGE A FILE NAME |
| MKDIR | GENERATE A DIRECTORY |
| RMDIR | REMOVE A DIRECTORY |
| STATFS | OBTAIN A FILE SYSTEM STATE |
| GET-ATTR | OBTAIN A FILE ATTRIBUTE |
| SET-ATTR | SET A FILE ATTRIBUTE |
| SEARCH_DISCON | DETECT WHETHER A SPECIFIED SECTION INCLUDES A DISCONTINUOUS BOUNDARY (ZONE BOUNDARY) |

| AV FILE SYSTEM UNIT 103 | |
|---|---|
| MERGE | MERGE OF AVFILE1+BUFFER+AV FILE2 |
| SPLIT | SPLIT AN AV FILE |
| SHORTEN | DELETE AN EDGE OF AV FILE |
| REPLACE | REPLACE A PART OF AV FILE |

FIG. 23

| VOBU NO. | NUMBER OF PACKS IN FIRST REFERENCE PICTURE IN VOBU | NUMBER OF PACKS IN VOBU |
|---|---|---|
| #1 | 14 | 46 |
| #2 | 15 | 51 |
| #3 | 13 | 49 |
| #4 | 14 | 47 |
| #5 | 14 | 46 |
| #6 | 15 | 51 |
| #7 | 13 | 49 |
| #8 | 14 | 47 |
| #9 | 14 | 46 |
| #10 | 15 | 51 |
| #11 | 13 | 49 |
| #12 | 14 | 47 |
| ⋮ | ⋮ | ⋮ |
| #21 | 15 | 51 |
| #22 | 13 | 49 |
| ⋮ | ⋮ | ⋮ |

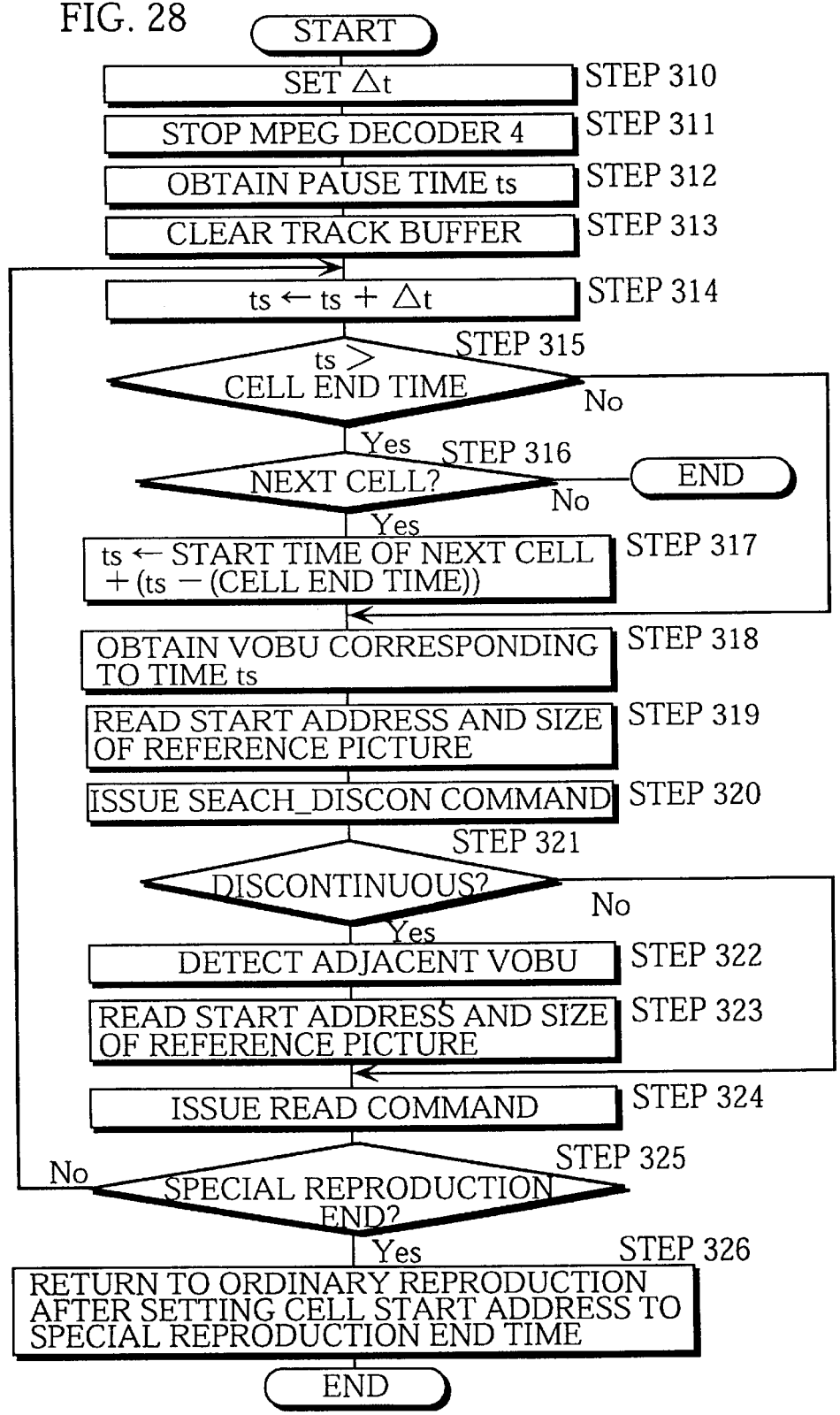

OPTICAL DISC, RECORDING APPARATUS, AND COMPUTER-READABLE RECORDING MEDIUM

This is a Divisional of Ser. No. 09/154,896, filed Sep. 17, 1998 U.S. Pat. No. 6,078,727.

BACKGROUND OF THE INVENTION

(1) Field of the Invention

This invention relates to an optical disc used for recording video data, a recording apparatus, and a computer-readable recording medium recording a file management program.

(2) Description of the Prior Art

Recently, optical discs such as CD-ROMs and DVD (Digial Versatile Disc)-ROMs have been used for recording video data (also called AV data in this document) of movies or the like, as well as being used as secondary storages for computers. Currently, practical uses of DVD-RAMs are awaited because of the general expectation that DVD-RAMs will be popular as the main recording medium of the next generation.

First, conventional DVD-ROMs are explained in terms of special reproductions. The special reproductions include fast forwarding or rewinding AV data at a speed n times as high as the normal reproduction speed (hereinafter such a speed is called n-speed).

The AV data to be recorded in DVD-ROMs is compressed with a compression encoding method at a variable bit rate to increase the compression rate. The "variable bit rate" means that the amount of compressed image data per one frame is variable. As a result, the amount of compressed data is not proportionate to the reproduction period. When this happens, even if the coded AV data is read out at steady intervals, that is at every predetermined size of the coded AV data, the read-out AV data does not correspond to images to be sectioned per predetermined time period.

To relate the amount of compressed data to the reproduction period, information of each special reproduction is inserted into necessary points in the AV data in DVD-ROMs. More specifically, the AV data is compressed in compliance with MPEG2. Through the compression, information called NV pack which is unique to DVD is added to the star of each GOP (Group of Pictures). GOPs are sections which each have a period of 0.4 to 1.0 seconds. Exceptionally, an end of a VOB (Video OBject) has a GOP of 1.2 seconds. Data included between one NV pack and the next NV is called VOBU (Video OBject Unit).

Each NV pack includes 2 K-bytes of information use for referring to adjacent NV packs. Each NV pack also includes the data size of the first reference picture in a GOP. The information used for referring to adjacent NV packs is composed of relative addresses of NV packs of VOBUs in the forward and backward directions separated by a predetermined time period from the current VOBU, the relative addresses being obtained based on the start time code of the current VOBU. The predetermined time period may be one to 15, 20, 60, 120, and 240 seconds.

Secondly, operations of special reproductions such as fast forwarding and rewinding are described. The special reproductions substantially at a steady speed are attained by reproducing only the reference pictures of VOBUs having a predetermined time interval in between, in accordance with the reproduction speed. To sequentially read out the VOBUs having a predetermined time interval in between, the information used for referring to adjacent NV packs in each NV pack is used.

A time search map is recorded in every time code that is arranged with a predetermined time interval in between from the start of the AV data. The time search map indicates an address of a piece of AV data in the VOBU corresponding to the current time code. By referring to the time search maps, reproduction apparatuses can start reproducing the AV data starting from the specified time codes.

However, it has been impossible to apply the method of inserting the special reproduction information into AV data to real-time recording of data into recording mediums such as DVD-RAMs.

This is because in real-time recording of AV data, information on a part of the AV data to be recorded from now on (e.g., addresses of NV packs in the backward direction) cannot be obtained.

Also, it is possible to generate special reproduction information to be recorded in each NV pack after the AV data is recorded. However, to record the generated information into an AV data storage area as NV packs, the same number of accesses to the disc as the number of VOBUs are required. This cannot be achieved in real time.

Some may think that this problem will be solved by storing the AV data and the special reproduction information in different AV data areas. However, this solution has another problem that to store the special reproduction information in a main memory, the main memory should have a large capacity, where the storage of the special reproduction information in the main memory is necessary to execute the special reproductions at high speed.

SUMMARY OF THE INVENTION

It is therefore an object of the present invention to provide an optical disc recording apparatus for generating special reproduction information of reduced amount while AV data is recorded onto the disc in real time, and an optical disc onto which data is recorded by the optical disc recording apparatus.

The above object is achieved by an optical disc including a data area and a time map area, the data area storing one or more video objects and the time map area storing time map information, where each video object includes a plurality of video object units. The time map information includes a first time table and a second time table, i.e., a pair of time tables, for each video object. Each first time table includes: addresses of video object units in a corresponding video object, the addresses being arranged in order and indicating storage positions of the video object units that correspond to reproduction points that differ by a predetermined time unit, the predetermined time unit being longer than a maximum reproduction period of a video object unit; and indicators for specifying the video object units which respectively correspond to the addresses. Each second time table includes an entry for each video object unit in the corresponding video object, the entries being arranged in order and each including a reproduction period of a video object unit and a data size of the video object unit.

With the above construction, the first time table has a small size since the first time table only records storage positions of video object units at predetermined intervals. For the second time table, it is not required to record a storage position of each video object unit in relation with a reproduction point. The second time table also includes a reproduction period and a data size for each video object unit. As a result, the second time table also has a small size since the reproduction period is smaller than the data size. It is very easy to generate the second time table while data is recorded onto the disc since the second time table is recorded in units of video object units which are the unit of encoding.

In the above optical disc, each first time table may include a plurality of first time maps which each correspond to a different one of the reproduction points, and each second time table may include a plurality of second time maps which each correspond to a different one of the plurality of video object units. Each first time map includes: one of the indicators, the indicator indicating a second time map for a video object unit that corresponds to the reproduction point, an address of the video object unit that corresponds to the reproduction point, and difference information indicating a difference between the corresponding reproduction point and a reproduction start time of the corresponding video object unit. Each second time map includes time information indicating a reproduction period of a corresponding video object unit, and also includes a data size of the corresponding video object unit.

In the above optical disc, the time map information may include a time offset for each video object, each time offset indicating a difference between a first reproduction point during a reproduction of the corresponding video object and a start time of a first video object unit in the corresponding video object.

With the above construction, it is possible to correct the time map information without difficulty by changing the value of the time offset even if the first part of a video object is cut by editing.

The above object is also achieved by a recording apparatus including: an input unit for receiving video data in a time series; a compression unit for compressing the received video data to generate a video object which, includes a sequence of video object units; a write unit for writing data onto an optical disc; and a control unit for controlling the write unit, where the control unit controls the write unit to write the generated video object onto the optical disc, generates a first time table and a second time table, and controls the write unit to write the generated first time table and second time table. Each first time table includes: addresses of video object units in a corresponding video object, the addresses being arranged in order and indicating storage positions of the video object units that correspond to reproduction points that differ by a predetermined time unit, the predetermined time unit being longer than a maximum reproduction period of a video object unit; and indicators for specifying the video object units which respectively correspond to the addresses. Each second time table includes an entry for each video object unit in the corresponding video object, the entries being arranged in order and each including a reproduction period of a video object unit and a data size of the video object unit.

With the above construction, the first time table has a small size since the first time table only records storage positions of video object units at predetermined intervals. For the second time table, it is not required to record a storage position of each video object unit in relation with a reproduction point. The second time table also includes a reproduction period and a data size for each video object unit. As a result, the second time table also has a small size since the reproduction period is smaller than the data size. It is very easy to generate the second time table while data is recorded onto the disc since the second time table is recorded in units of video object units which are the unit of encoding.

In the above recording apparatus, each first time table may include a plurality of first time maps which each correspond to a different one of the reproduction points, and each second time table may include a plurality of second time maps which each correspond to a different one of the plurality of video object units. Each first time map includes: one of the indicators, the indicator indicating a second time map for a video object unit that corresponds to the reproduction point, an address of the video object unit that corresponds to the reproduction point, and difference information indicating a difference between the corresponding reproduction point and a reproduction start time of the corresponding video object unit. Each second time map includes time information indicating a reproduction period of a corresponding video object unit, and also includes a data size of the corresponding video object unit.

In the above recording apparatus, the time map information may include a time offset for each video object, each time offset indicating a difference between a first reproduction point during a reproduction of the corresponding video object and a start time of a first video object unit in the corresponding video object.

With the above construction, it is possible to correct the time map information without difficulty by changing the value of the time offset even if the first part of a video object is cut by editing.

BRIEF DESCRIPTION OF THE DRAWINGS

These and other objects, advantages and features of the invention will become apparent from the following description thereof taken in conjunction with the accompanying drawings which illustrate a specific embodiment of the invention. In the drawings:

FIG. 4 shows a hierarchical relation between zone areas, ECC blocks, and sectors;

FIG. 20 shows a list of commands supported by the AV file system unit 103 and common file system unit 104 for the file management;

FIG. 23 shows an example of the GOP information;

FIG. 28 is a flowchart showing the process of the special reproduction performed by the AV data reproducing unit 130.

Figure 1:
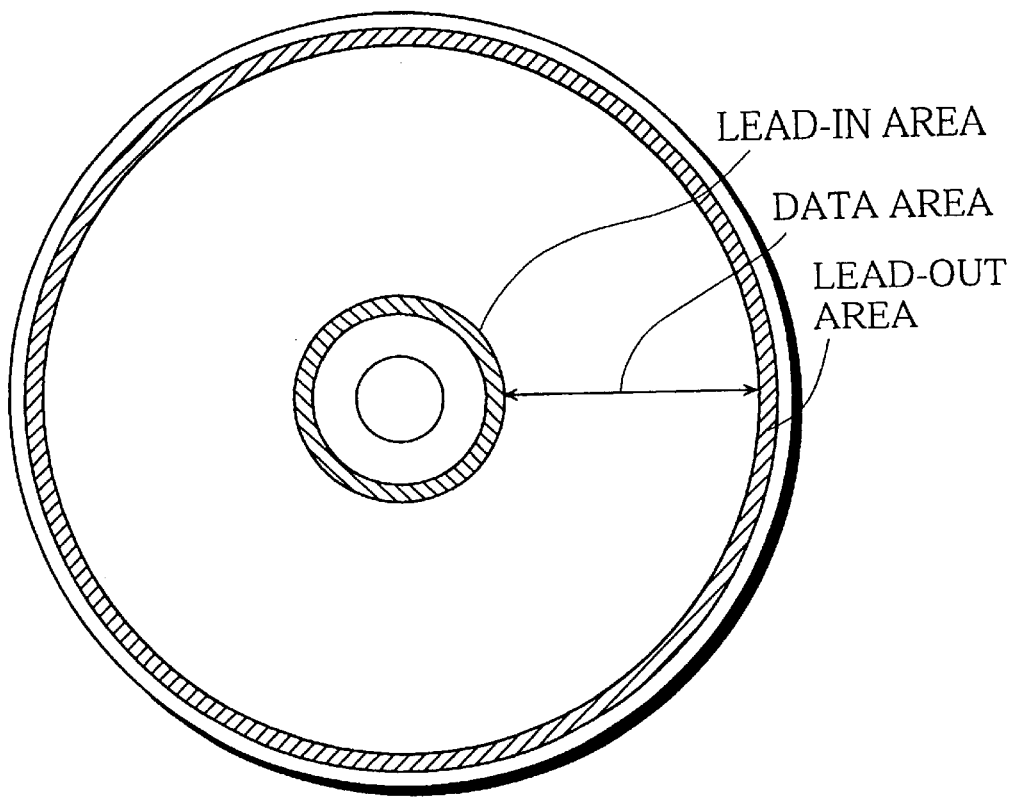
FIG. 1 shows the appearance and the recording area of the DVD-RAM disc which is the optical disc of the present invention described in the embodiment.

DESCRIPTION OF THE PREFERRED EMBODIMENTS (1) Optical Disc
(1-1) Physical Structure of Optical Disc FIG. 1 shows the appearance and the recording area of a DVD-RAM disc which is an optical disc. As shown in the figure the DVD-RAM disc has a lead-in area at its innermost periphery and a lead-out area at its outermost periphery, with the data area in between. The lead-in area records the necessary reference signals for the stabilization of a servo during access by an optical pickup, and identification signals to prevent confusion with other media. The lead-out area records the same type of reference signals as the lead-in area.

The data area, meanwhile, is divided into sectors which are the smallest unit by which the DVD-RAM can be accessed. Here, the size of each sector is set at 2 KB. The data recorded in the data area includes file system management information, AV data, AV data management file, and non-AV data.

The file system management information includes a directory structure of the DVD-RAM disc, positions of the recorded files, and information of the state of data area assignment. The file system management information is used when files are created, written, read, or deleted.

The AV data is recorded in units of files which respectively correspond to Video OBjects (VOBs). Each VOB is recorded into the disc by an optical disc recording apparatus in one consecutive recording. The contents of the VOBs are, for example, a whole or a part of a movie, or a whole or a part of a TV program. Each VOB is composed of a plurality of Video OBject Units (VOBUs).

Each VOBU includes AV data corresponding to 0.4 to 1.2 seconds of reproduction. Each VOBU includes at least one GOP (Group of Picture) which is the image data section defined in MPEG2 standard. Each GOP includes at least one I(Intra)-picture defined in MPEG2 standard, where each GOP may also include P (Predictive)-pictures and B (Bidirectionally predictive)-pictures defined in MPEG2 standard. This enables independent reproduction of the GOPs. Especially, in special reproductions such as fast forwarding and rewinding, or reproduction at specified times, the I-pictures in the GOPs are extracted to be reproduced. Alternatively, the I-pictures are extracted as reference pictures for the P- or B-pictures to be reproduced.

An AV data management file is a file used to manage the AV data in a DVD-RAM. The file includes one or more pieces of time map information which correspond to one or more VOBs. The time map information shows relationships between the reproduction points (times) and the storage positions of the AV files (i.e. VOBs). The time map information is used to convert arbitrary VOB reproduction times to VOB storage positions. The time map information has a hierarchical data structure. That is, the time map information includes a first time table and a second time table in a hierarchy.

The first time table (also called a time map table or a TMAP table) includes: storage positions (sector addresses: LSNs (Logical Sector Numbers)) of video object units in a corresponding video object, the reproduction points differing by a predetermined time unit (e.g., 60 seconds); and indicators for specifying the video object units which respectively correspond to the storage positions.

The second time table (also called a VOBU table) includes an entry for each video object unit in the corresponding video object, the entries being arranged in order and each including a reproduction period of a video object unit and a data size of the video object unit.

Figure 2:
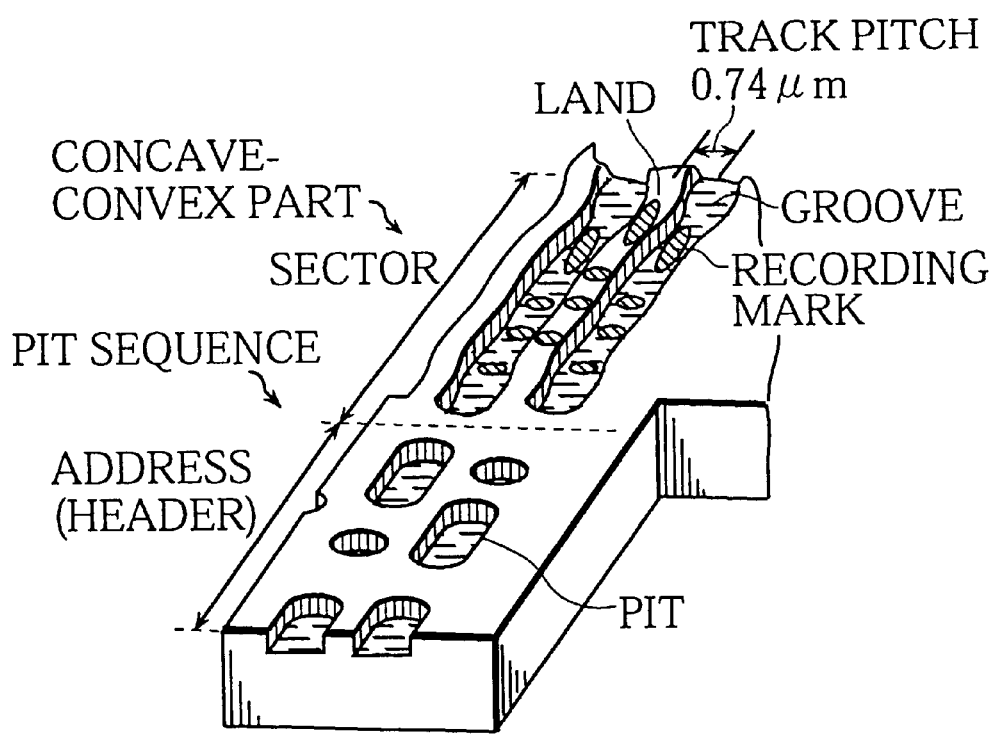
FIG. 2 shows the cross-section and surface of a DVD-RAM cut at the header of a sector.

FIG. 2 shows the cross-section and surface of a DVD-RAM cut at the header of a sector. As shown in the figure, each sector is composed of a pit sequence that is formed in the surface of a reflective film, such as a metal film, and an uneven part.

The pit sequence is composed of 0.4 $\mu$m~1.87 $\mu$m pits that are carved into the surface of the DVD-RAM to show the sector address.

The uneven part is composed of a concave part called a "groove" and a convex part called a "land". Each groove and land has a recording mark composed of a matal film capable of phase change attached to its surface. Here, the expression "capable of phase change" means that the recording mark can be in crystalline state or a non-crystalline state depending on whether the metal film has been exposed to a light beam. Using this phase change characteristic, data can be recorded into this uneven part. While it is only possible to record data onto the land part of an MO (Magnetic-Optical) disc, data can be recorded onto both the land and the groove parts of a DVD-RAM, meaning that the recording density of a DVD-RAM exceeds that of an MO disc. Error correction information is provided on a DVD-RAM for each group of 16 sectors. In the present embodiment, each group of 16 sectors that is given an ECC (Error Correcting Code) is called an ECC block.

On a DVD-RAM, the data area is divided into a plurality of zone areas to realize rotation control called Z-CLV(Zone-Constant Linear Velocity) during recording reproduction.

Figure 3A:
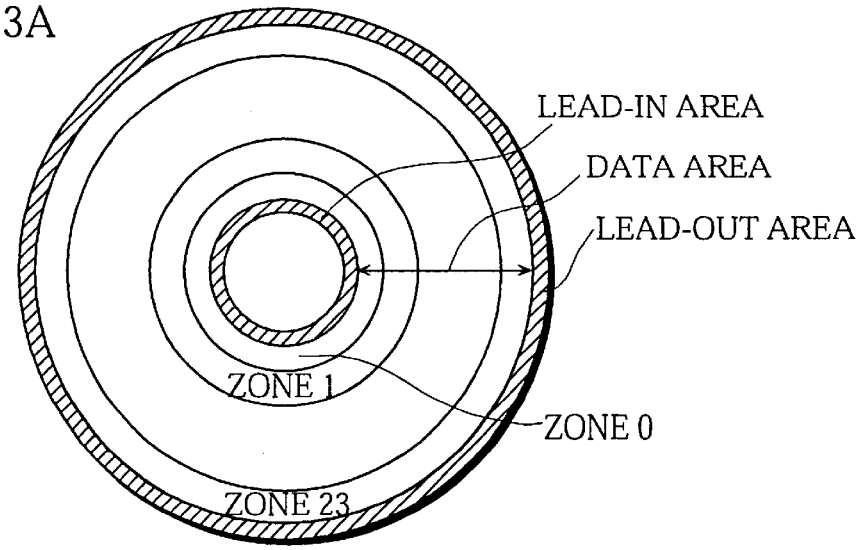
FIG. 3A shows the plurality of zone areas 0–23 and other areas provided on a DVD-RAM.

FIG. 3A shows the plurality of zone areas provided on a DVD-RAM. As shown in the figure, a DVD-RAM is divided into 24 zone areas numbered zone 0 to zone 23. Each zone area is a group of tracks that are accessed using the same angular velocity. In this embodiment, each zone area contains 1888 tracks. The rotational angular velocity of the DVD-RAM is set separately for each zone area, with this velocity being higher the closer a zone area is located to the inner periphery of the disc. This ensures that the optical pickup can move at a constant velocity while performing access within a single zone area. By doing so, the recording density of DVD-RAM is raised, and rotation control is made easier during recording and reproduction.

Figure 3B:
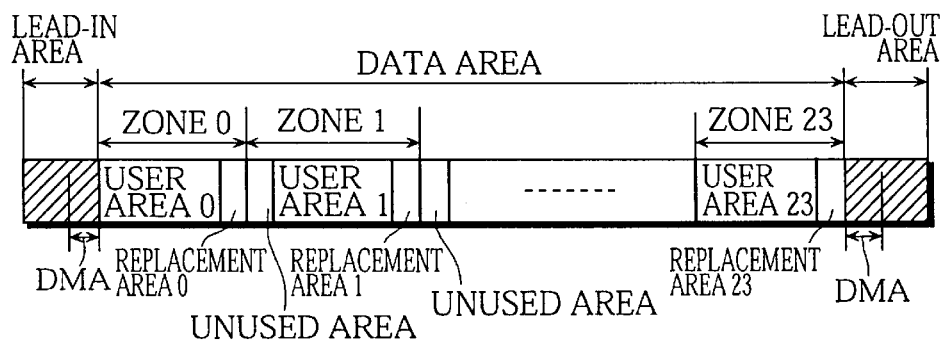
FIG. 3B shows a horizontal arrangement of the zone areas 0–23 and other areas.

FIG. 3B shows a horizontal arrangement of the lead-in area, the lead-out area, and the zone area 0–23 that were shown FIG. 3A.

The lead-in area and lead-out area each have a DMA (Defect Management Area) inside. The DMA records: position information showing the positions of sectors found to include defects; and replacement position information showing the positions of the sectors replacing the defective sectors located in a replacement area.

Each zone area has a user area on the inside, and the replacement area and an unused area are provided at the boundary between zone areas. The user area is an area that can be use by the file system as a recording area. The replacement area is used to replace defective sectors when such defective sectors are found. The unused area is an area that is not used for recording data. Only two tracks are assigned as the unused area, with such unused area being provided to prevent mistaken identification of sector addresses. This is because while sector addresses are recorded at a same position in adjacent tracks within the same zone, for Z-CLV the sector addresses are recorded at different positions in adjacent tracks at the zone boundary.

In this way, sectors which are not used for data recording exist at the boundaries between zone areas. Therefore, on a DVD-RAM, logical sector numbers (LSN: Logical Sector Number) are assigned to physical sectors of the user area in order starting from the inner periphery to consecutively show only the sectors used for recording data.

Figure 3C:
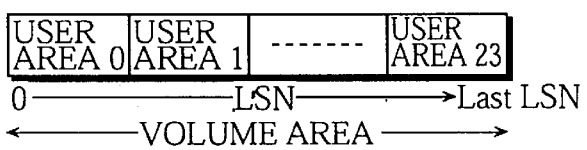
FIG. 3C shows logical sector numbers (LSNs) in the volume area.

As shown in FIG. 3C, the area that records user data and is composed of sectors that have been assigned LSNs is called volume area.

Figure 3D:
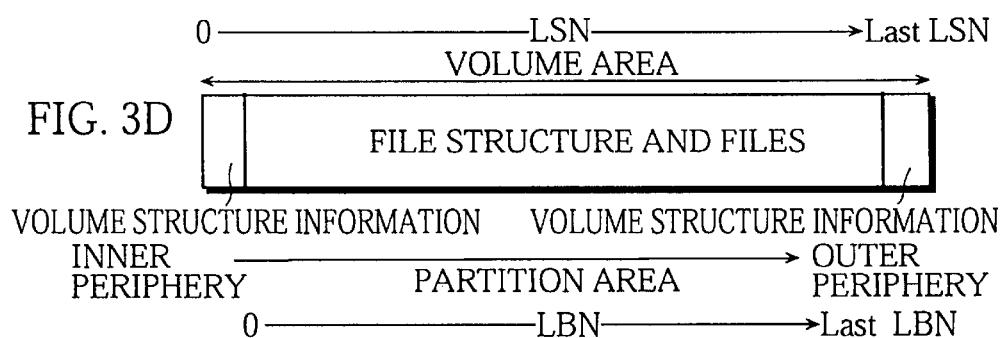
FIG. 3D shows logical block numbers (LBNs) in the volume area.

Also, as shown in FIG. 3D, in the innermost and outermost peripheries, volume structure information is recorded to be used to deal with the disc as a logical volume. The rest of the volume area except the areas for recording the volume structure information is called partition area. The partition area records files. The logical block numbers (LBN: Logical Block Number) are assigned to sectors of the partition area in order starting from the first sector.

FIG. 4 shows a hierarchical relation between zone areas, ECC blocks, and sectors. As shown in the drawing, each zone area includes a plurality of ECC blocks. It should be noted here that in the optical discs, areas in units of sectors are assigned to non-AV data, while areas in units of consecutive recording areas are assigned to AV data so that each consecutive recording area secures uninterrupted reproduction of the AV data. Here, each consecutive recording area is composed of consecutive sectors in units of ECC blocks (in other words, each area is an integral multiple of an ECC block) and has a predetermined size (about 7 MB) or more, each consecutive recording area not outstepping the boundary between zones. However, when the AV data includes a plurality of extents, the last extent may be smaller than the predetermined size. The reason why it is defined that each consecutive recording area does not outstep the boundary between zones is that an outstepping of the boundary will change the rotation angular velocity of the optical disc, which will disturb the uninterrupted reproduction. The reason why each consecutive recording area is an integral multiple of an ECC block is that the ECC block is the minimum unit dealt with in the ECC process.

Figure 5:
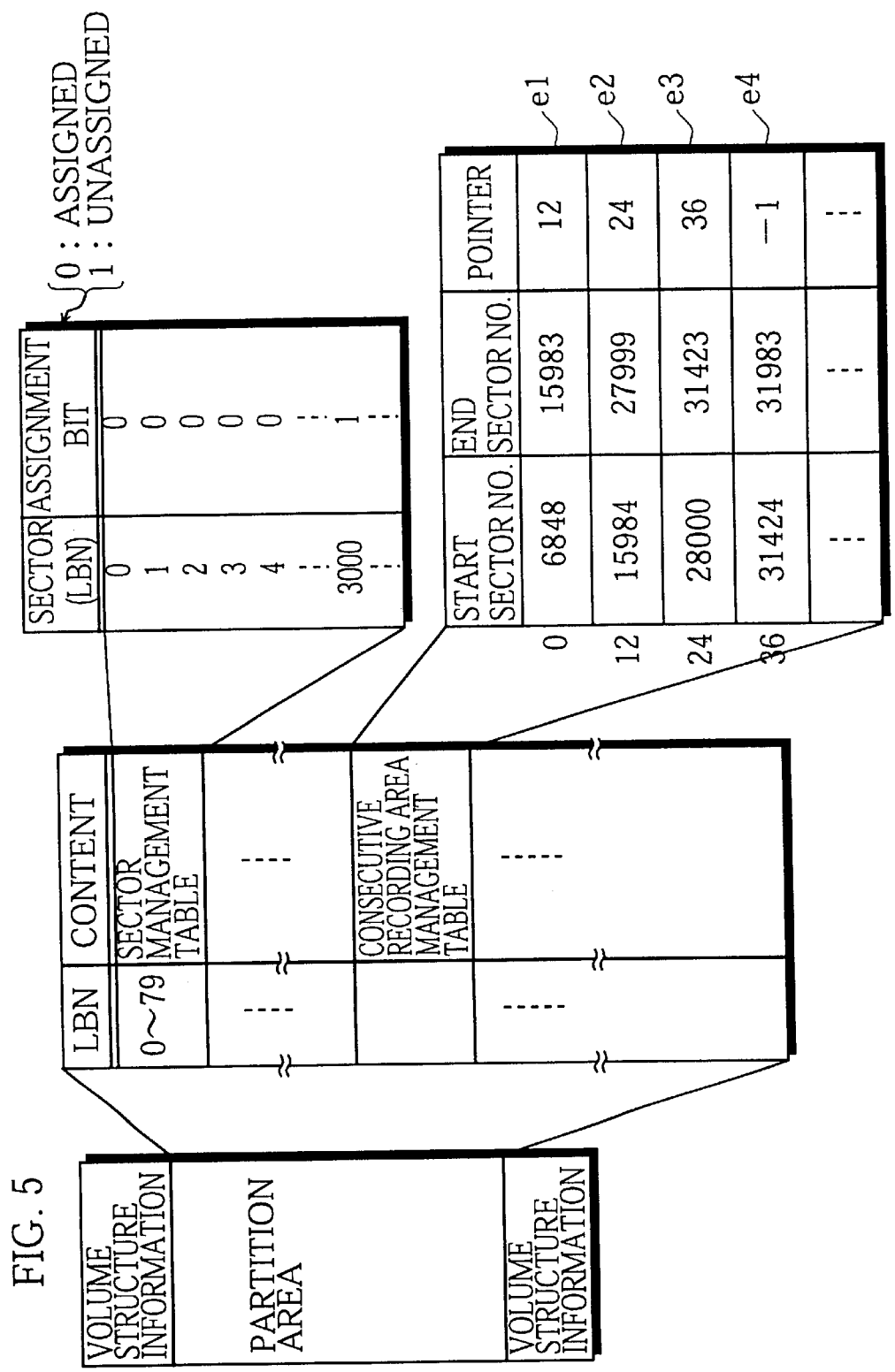
FIG. 5 shows a sector management table (space bit map) and a consecutive recording area management table recorded in the volume area.

FIG. 5 shows a sector management table (space bit map) and a consecutive recording area management table. The sector management table is recorded in the partition area of the volume area and is included in the file system management information. The consecutive recording area management table is used to manage the consecutive recording areas. The drawing also shows a hierarchical relation between the volume area, sectors, and contents of the sectors.

The first layer shows the volume area shown in FIG. 3D.

The second layer shows sector areas which include a sector management table. The sector areas are included in the partition area. The sector management table (also called a space bit map) showing the data assignment status for each sector is recorded in the sector areas with logical block numbers 0–79. The consecutive recording area management table, recorded as a non-AV file and as a normal file, is not recorded in a fixed area.

As shown in the third layer, the "space bit map" column shows whether each sector included in the partition area is assigned or not-assigned. In this example, the assignment state of each sector is indicated by one bit. For example, each sector for logical block numbers 0–79 is given bit "0" (indicating "assigned") since these sectors have already been assigned as space bit map.

As shown in the third layer, the consecutive recording area management table shows areas in the partition area having been assigned as consecutive recording areas. In the FIG. 5, the consecutive recording area management table is described as a table in format of a list including entries e1, e2, e3, e4, . . . Outside on the left-hand side of the table, entries' relative addresses (the numbers of bytes) which are relative to the start of the table are shown.

As shown in the drawing from left to right, each entry is composed of a start sector number (LSN), an end sector number, and a pointer. Sectors between the specified start sector number and end sector number correspond to a part of or a whole consecutive recording area. The pointers indicate the positions of the next entries by their relative addresses. The pointer of the last entry has a value "−1" which indicates it is the last entry.

In the present example shown in FIG. 5, entry e1 is a consecutive recording area including consecutive sectors with sector numbers 6848 to 15983. The entry e1 has information (pointer) indicating that the next entry e2 is an area starting from the $12^{th}$ byte. The other entries are similar to the entry e1 In the present example, the entries e1–e4 are formed by one consecutive recording area composed of consecutive sectors with sector numbers 6848 to 31983. This suggests that the AV data has been recorded four times and that a consecutive recording area was added each time the AV data was recorded.

The space bit map column should be written in connection with the assignment of consecutive recording areas. For example, in an optical disc recording apparatus, areas assigned as the consecutive recording areas are indicated as the assigned are also in the space bit map column.

Figure 6:
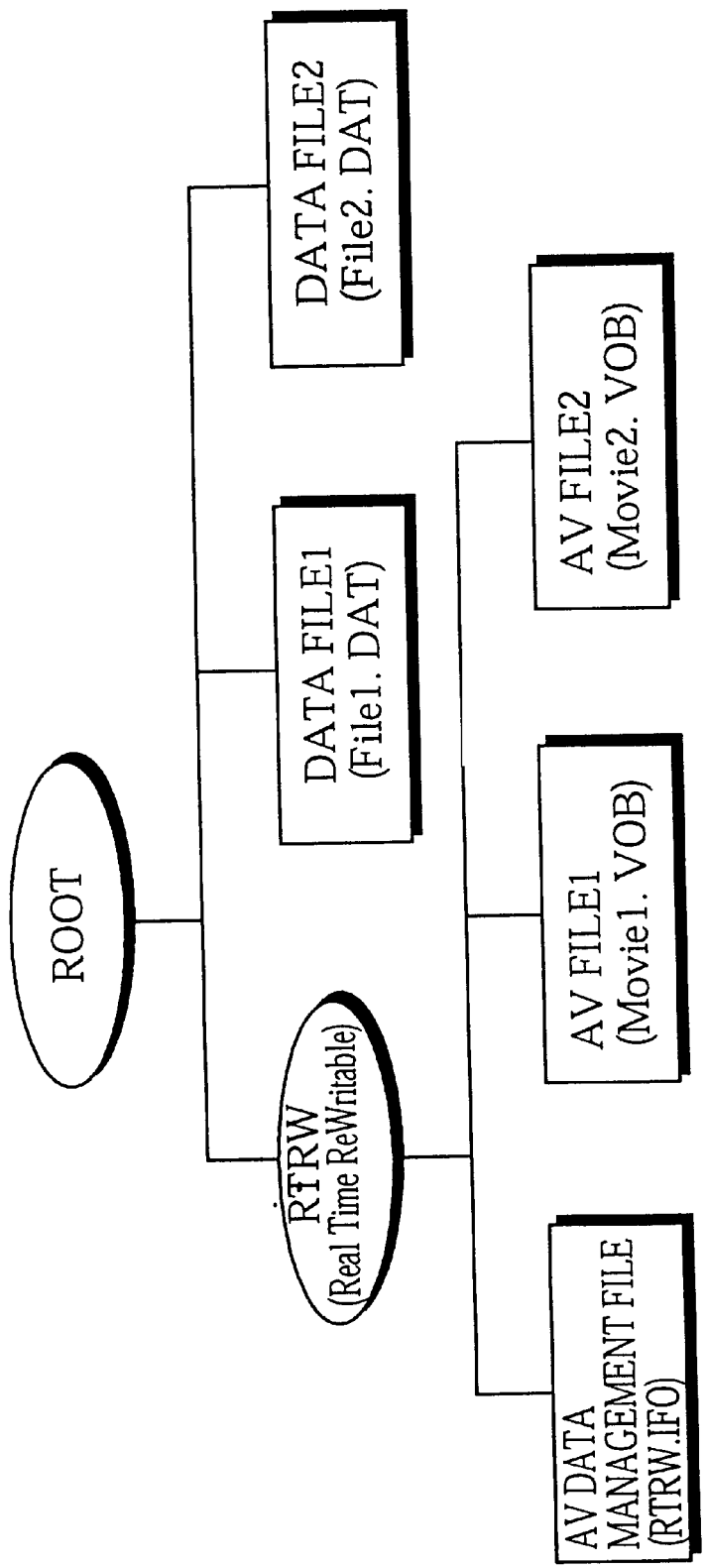
FIG. 6 shows a hierarchical directory structure of AV files and non-AV files.

FIG. 6 shows an example of a file system of DVD-RAM in which AV data and non-AV data files are recorded.

In the drawing, ovals represent directories, and rectangles represent files.

Figure 7:
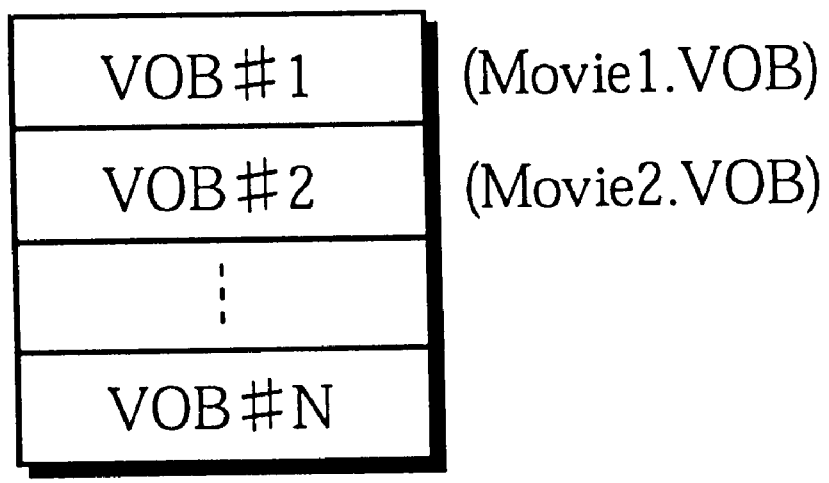
FIG. 7 shows VOBs recorded as AV files "Movie1.VOB," "Movie2.VOB," . . .

The root directory branches to a directory "RTRW" and two non-AV data files "File1.DAT" and "File2.DAT." The directory "RTRW" branches to a plurality of AV data files "Movie1.VOB," "Movie2.VOB," . . . and an AV data management file "RTRW.IFO." As shown in FIG. 7, the AV data files "Movie1.VOB," "Movie2.VOB, " . . . are stored in the data area respectively as VOBs.

(1.2) AV Data Management File

Figure 8:
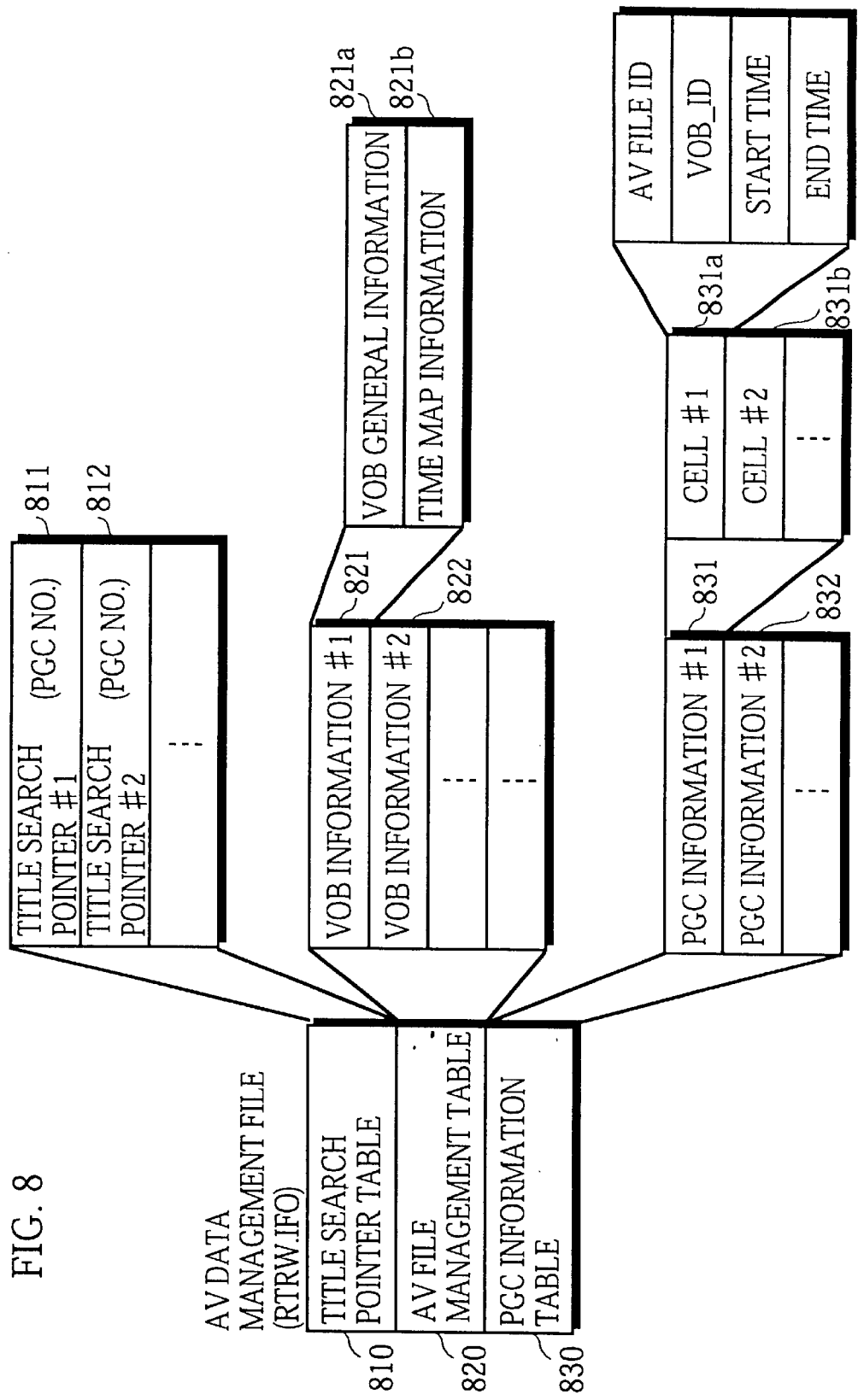
FIG. 8 hierarchically shows the contents of the AV data management file "RTRW.IFO"
Figure 9:
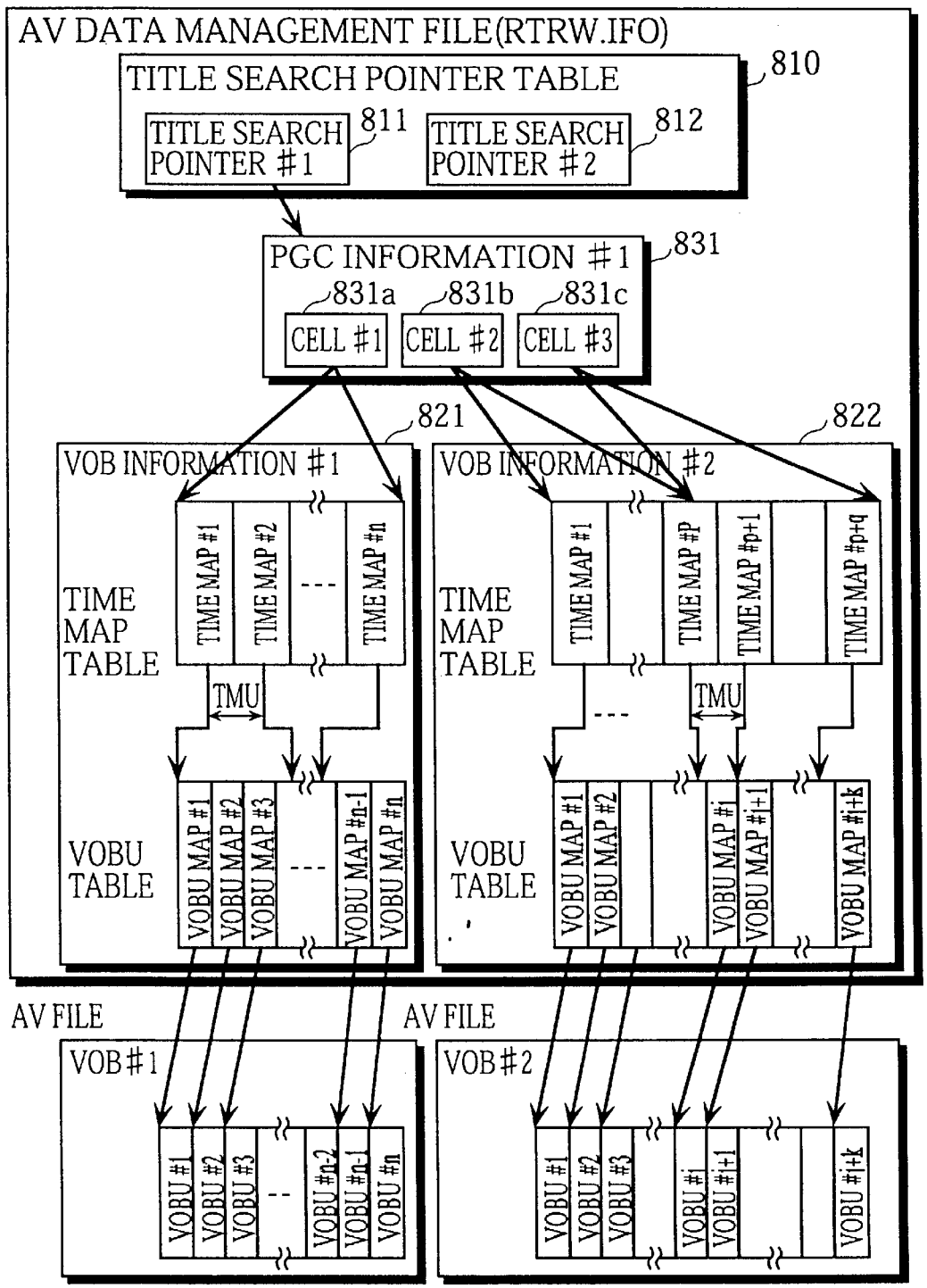
FIG. 9 shows logical relationships between the title search pointer table, PGC information table, and VOBs.

FIG. 8 hierarchically shows the contents of the AV data management file "RTRW.IFO" shown in FIG. 6. As shown in FIG. 8, the AV data management file includes a title search pointer table 810, an AV file management table 820, and a PGC information table 830. FIG. 9 shows logical relationships between these tables and VOBs.

The title search pointer table 810 includes a list of titles recorded in the DVD-RAM. Here, the titles may be programs recorded by users or may have been edited by the users. FIGS. 8 and 9 show only title search pointers 811, 812, . . . included in the title search pointer table.

The title search pointers 811, 812, . . . are pointers which indicate PGCs (or PGC information) corresponding to the titles. For example, the title search pointer 811 indicates PGC information 831. Here, each PGC is formed of a plurality of arbitrary AV data sections of arbitrary VOBs, the sections being logically linked. Each piece of PGC information shows a logical relationship between the plurality of arbitrary AV data sections of arbitrary VOBs.

The AV file management table 820 shows relationships between the reproduction points (times) and the storage positions of the AV files (i.e. VOBs). The table includes as many pieces of VOB information (VOB information 821, 822, . . . ) as the number of VOBs.

Each of the VOB information 821, 822, . . . includes VOB general information and time map information. The VOB general information is information, such as a reproduction period, unique to each VOB. The time map information shows relationships between the reproduction points (times) and the storage positions of the VOBUs.

The VOB general information 821a includes an identifier of the current VOB and the reproduction period of the VOB.

The time map information 821b includes the first time table and the second time table which have been described earlier.

As shown in FIG. 9, the first time table (time map table) is composed of time maps #1, #2, . . . which include: storage positions (sector addresses) of VOBUs laid on a time axis whose start is a start time of the current VOB, the storage positions being arranged in order and corresponding to reproduction points that differ by a predetermined time unit (e.g., 60 seconds); indicators for specifying the VOBUs which respectively correspond to the storage positions.

The second time table (VOBU table) is composed of VOBU maps #1, #2, . . . which include: reproduction periods and data sizes of the VOBUs, the VOBU maps being arranged in the order of reproduction of the corresponding VOBUs starting from the start of the current VOB.

The PGC information table 830 includes a plurality of pieces of PGC information 831, 832, . . .

The plurality of pieces of PGC information 831, 832, . . . are each a table which includes a list of video sections in VOBs, the sections being arranged in the reproduction order. The information specifying the video section are called cells. Each cell specifies a video section in a VOB by its start time and end time. Each piece of PGC information shows logically linked video sections of AV data specified by the cells.

Each of the cells 831a, 831b, . . . includes an AV file identifier, a VOB identifier, and a start time and end time of a video section.

In the example shown in FIG. 9, a sequence of AV data corresponding to a title is identified following the coarse of: title search pointer 811→PGC information 831→cells 831a to 831c→VOB information 821, 822→VOBs #1, #2. In this example, the AV data corresponding to a title is composed of two VOBs #1, #2. The most simplest example of PGC information, such as the case of a newly recorded title, is represented as: one title→one piece of PGC information→one cell→one piece of VOB information→one VOB. In such a case, one title is composed of one VOB.

Figure 10:
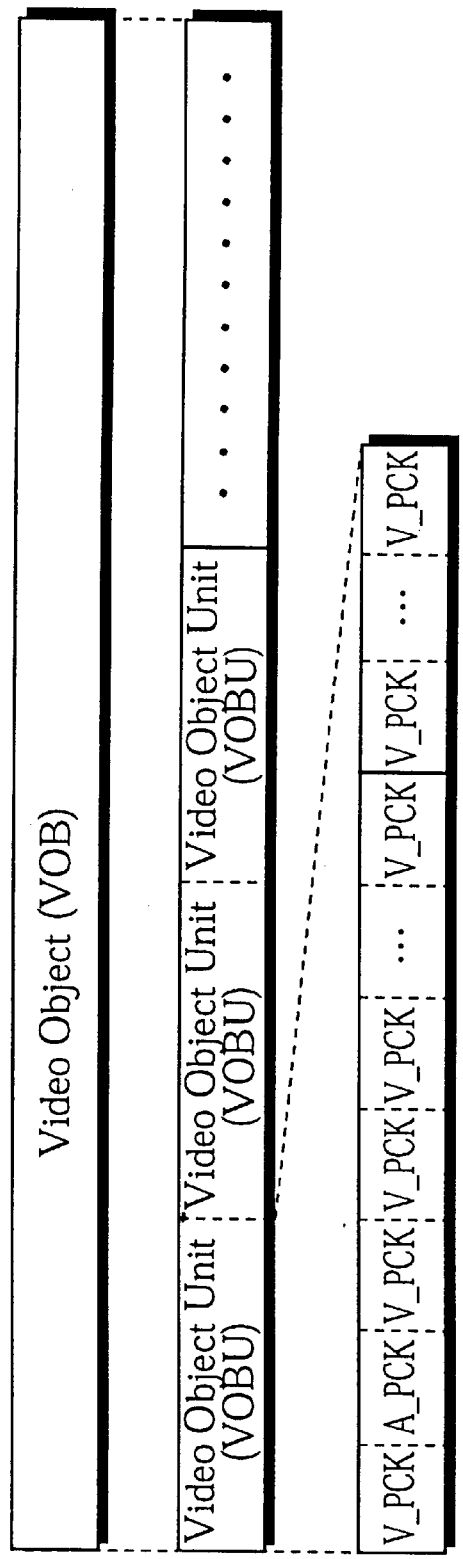
FIG. 10 shows the data structure of the AV file, namely the VOB.

FIG. 10 shows the data structure of the AV file, or the VOB. As shown in the drawing, each VOB is composed of a plurality of VOBUs. Each VOBU is an AV data section including compressed video data and audio data corresponding to about 0.5 seconds of reproduction and includes at least one I-picture. Each VOBU is composed of a sequence of interleaved video packs (V_PCK) and audio packs (A_PCK). Each pack includes a pack header, a packet header, and video/audio data, and has the same size as the sector size (2 KB). The packs correspond to the packed packets defined in MPEG2.

Figure 11:
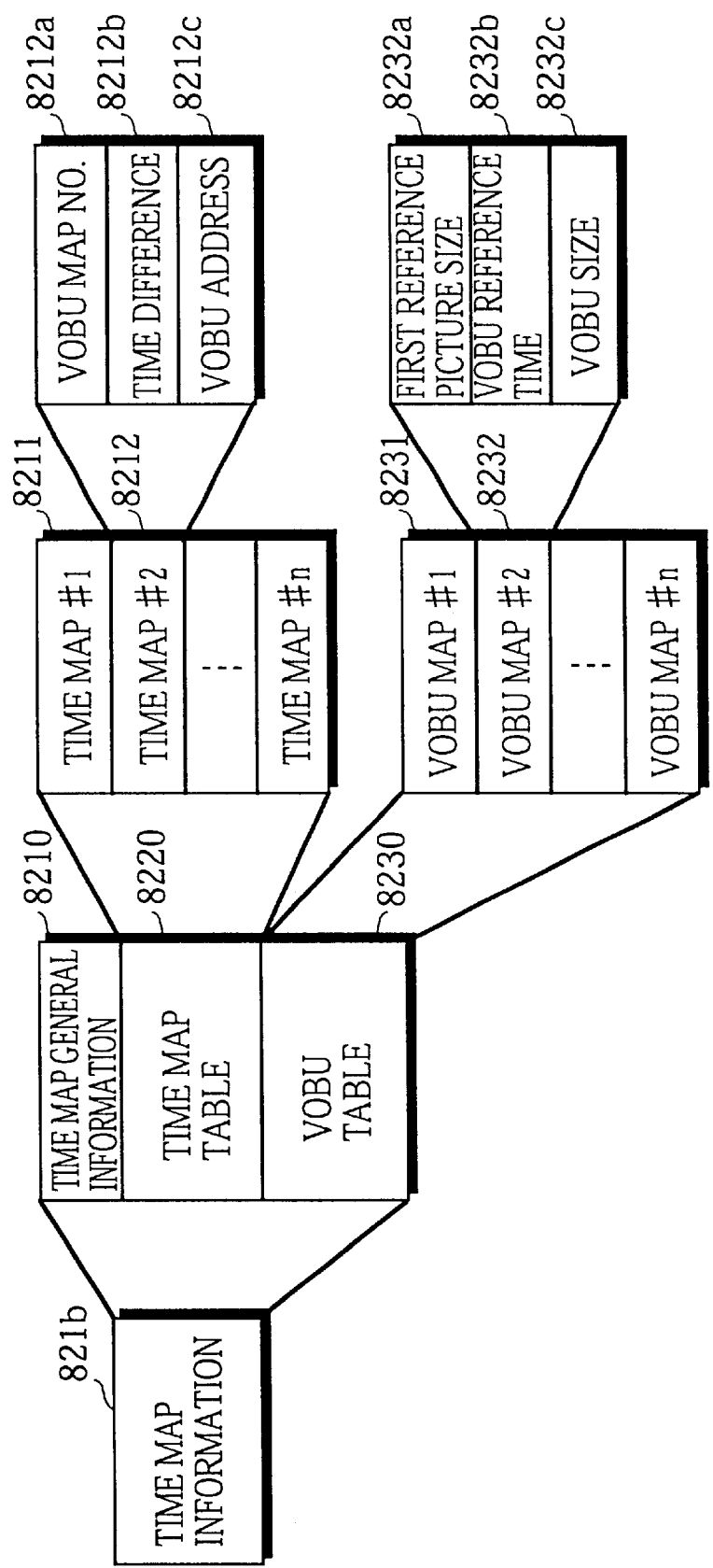
FIG. 11 shows the data structure of the time map information corresponding to a VOB.
Figure 12:
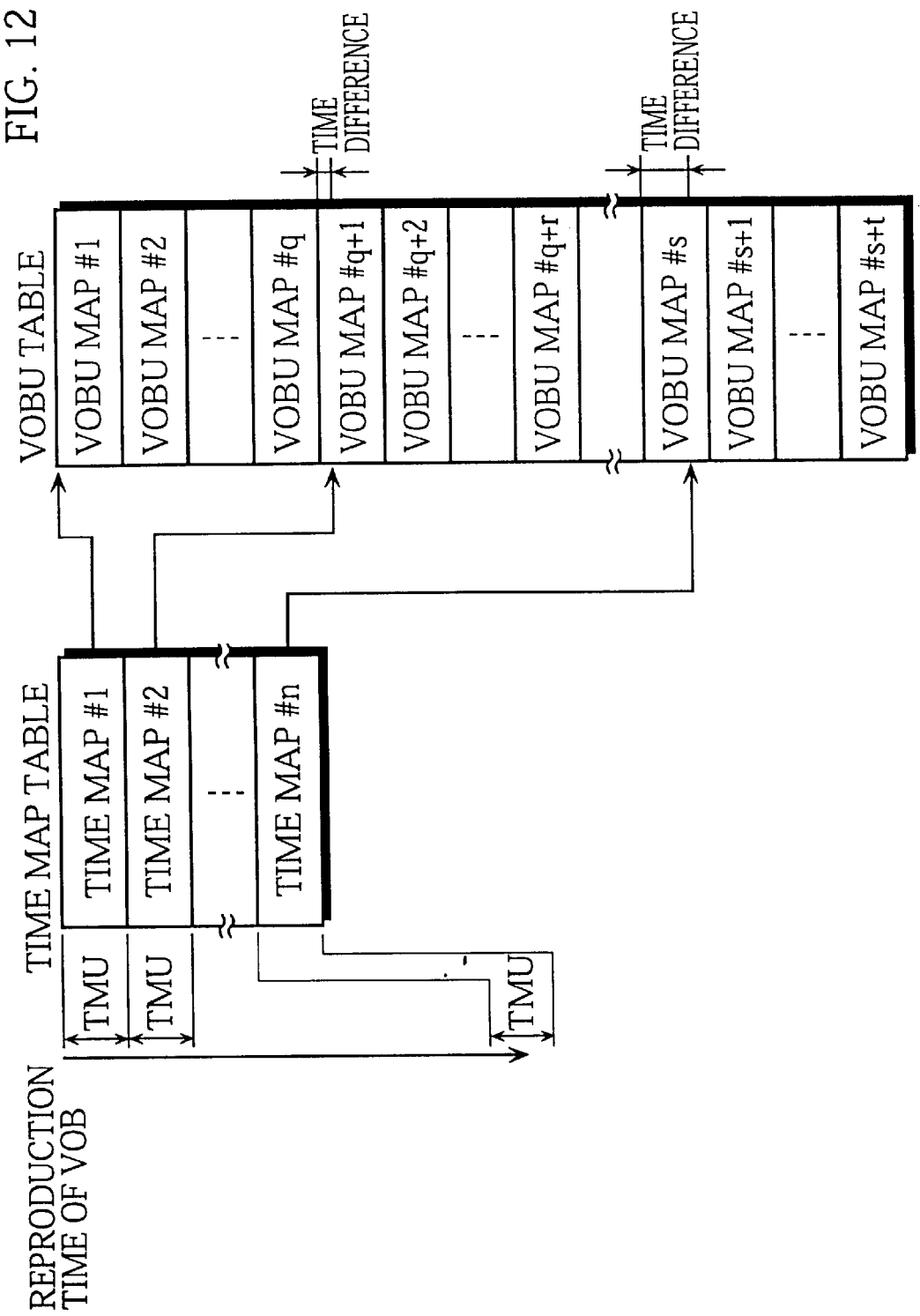
FIG. 12 shows the logical relationships between the time map table and the VOBU table.

FIG. 11 shows the data structure of the time map information corresponding to a VOB. In the drawing, the time map information 821b shows correlation between the reproduction points and the storage positions of VOBs. The time map information 821b is composed of a time map general information 8210, a time map table 8220, a VOBU table 8230. FIG. 12 shows the logical relationships between the time map table and the VOBU table.

The time map general information 8210 includes the number of time maps and the number of VOBU maps included in the time map information, a time unit (also referred to as TMU) which shows a predetermined time period set between the time maps, and a time offset (also referred to as TM_OFS) which shows a time difference between the start time of the current VOB and the time of the first time map.

The time map table 8220 includes a plurality of time maps 8211, 8212, . . . which are arranged in order of time at intervals of TMU. The time map 8211 specifies a VOBU map corresponding to a time that is obtained by adding TM_OFS to the start time of the current VOB. The time map 8212 specifies a VOBU map corresponding to a time obtained by adding one TMU to the time of the time map 8211. The time map 8213 specifies a VOBU map corresponding to a time obtained by adding two TMUs to the time of the time map 8211. The following time maps specify corresponding VOBU maps in a similar way.

Usually, the TM_OFS is "0" where, as described above, the time of the time map 8211 matches the start time of the current VOB. When, for example, the first part of the VOB is deleted by editing, TM_OFS shows a value other than "0."

Figure 13:
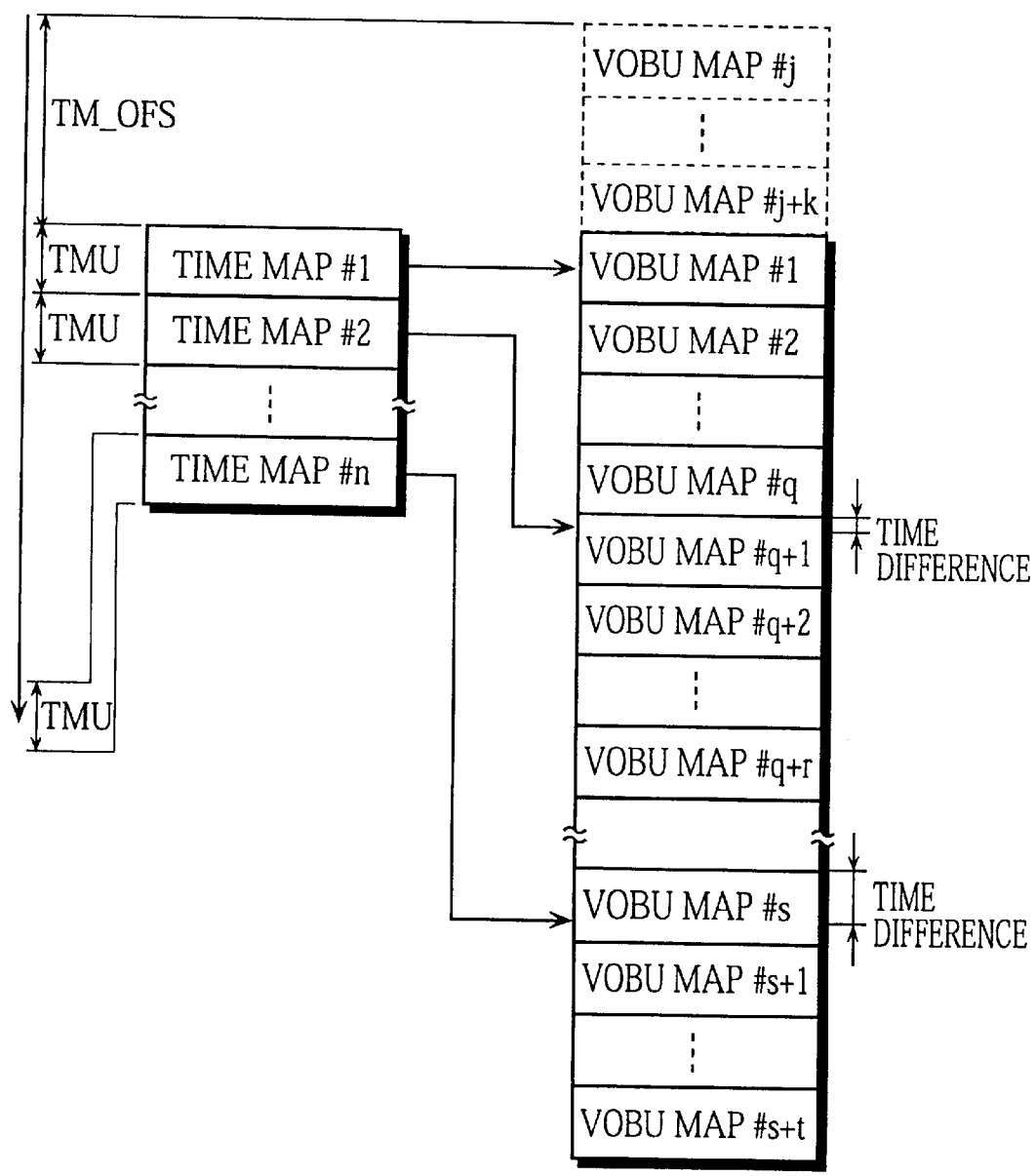
FIG. 13 shows the time offset which shows a time difference between the start time of the VOB and the time of the first time map.

FIG. 13 shows the logical relationships between the time map table and the VOBU table when the first part of the VOB is deleted. As understood from the drawing, the TM_OFS in this example shows a time difference between the start time of the current VOB and the time of the first time map, and it is set to be equal to the VOB reproduction time of the deleted first part of the VOB. This reduces the amount of calculation required to generate the time map table.

The reproduction point of time map #i (also referred to as time map time) is represented as:

TIME MAP TIME=($TMU*(i-1)+TM\_OFS$).

The time maps 8211, 8212, . . . each include a VOBU map number, a time difference (also referred to as TM_DIFF), and a VOBU address (also referred to as VOBU_ADR).

The VOBU map number 8212*a* is a VOBU map number which corresponds to the time map time of the time map 8212.

The TM_DIFF 8212*b* is a time difference between the start time of the current VOBU and the corresponding time map time. The start time of VOBU #j is represented as:

VOBU START TIME=(TMU*(j−1)+TM_OFS−TM_DIFF).

The VOBU_ADR 8212*c* is an address (a sector address of four bytes) indicating the start of a VOBU.

The VOBU table 8230 is a table including VOBU maps 8231, 8232, . . . which respectively correspond to the VOBUs included in the current VOB.

The VOBU maps 8231, 8232, . . . each include a reference picture size, a VOBU reproduction time, and a VOBU size.

The reference picture size 8232*a* is a size of the first I-picture of a VOBU. The size 8232*a* is used for reading a reference picture in the performances of special reproductions and reproductions at specified times.

The VOBU reference time 8232*b* is a period for which a VOBU is reproduced. The time 8232*b* is represented with one byte. The time 8232*b* is used for detecting a target image in the performances of special reproductions and reproductions at specified times. That is to say, the reproduction apparatus continues to add each VOBU reproduction time to the VOBU start time in sequential order until the addition result matches the time of the VOBU corresponding to the target image. The reproduction apparatus detects the target VOBU and then further detects the target image from the detected VOBU.

The VOBU size 8232*c* is a data size of a VOBU. The VOBU size 8232*c* having two bytes indicates the VOBU size by the number of sectors. The size 8232*c* is used for detecting the size of the target image in the performances of special reproductions and reproductions at specified times.

(2) Recording/Reproduction Apparatus

The optical disc recording/reproduction apparatus of the present invention is described with reference to the drawings.

(2-1) Entire System

Figure 14:
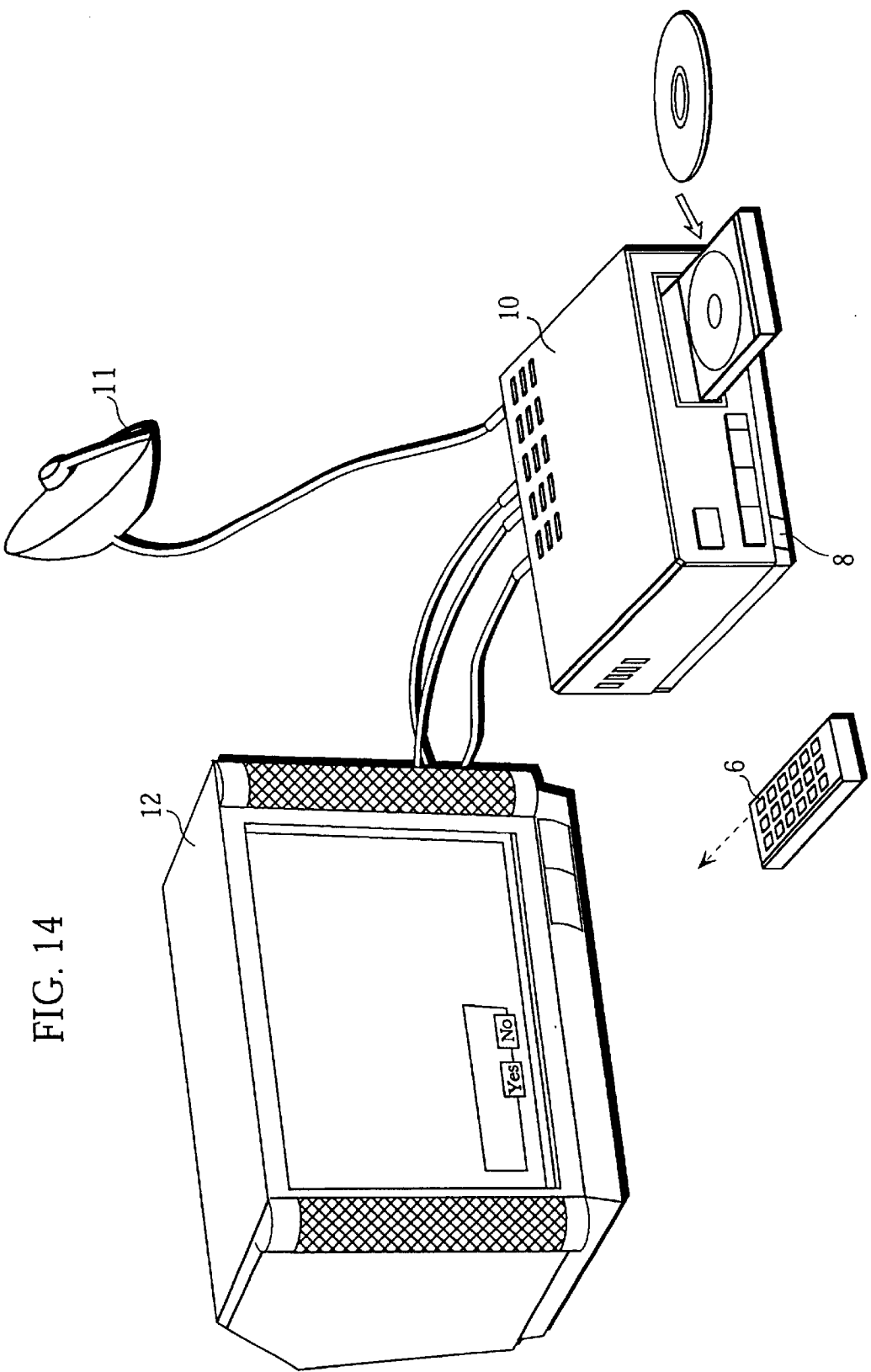
FIG. 14 shows the construction of a system including the optical disc recording/reproduction apparatus of the present embodiment.

FIG. 14 shows the construction of a system including the optical disc recording/reproduction apparatus of the present embodiment.

The system includes an optical disc recording/reproduction apparatus 10 (also referred to as DVD recorder 10), a remote controller 6 used for operating the DVD recorder 10, a DVD recorder display 12 connected to the DVD recorder 10, and an antenna 11.

After the DVD-RAM disc is loaded, the DVD recorder 10 compresses the video/audio data which is included in the analog broadcasting waves which is received through the antenna 11, records the compressed data as AV files into the DVD-RAM disc, expands the compressed video/audio data, and outputs the expanded video/audio signals onto a display 12.

(2-2) Hardware Structure of DVD Recorder 10

Figure 15:
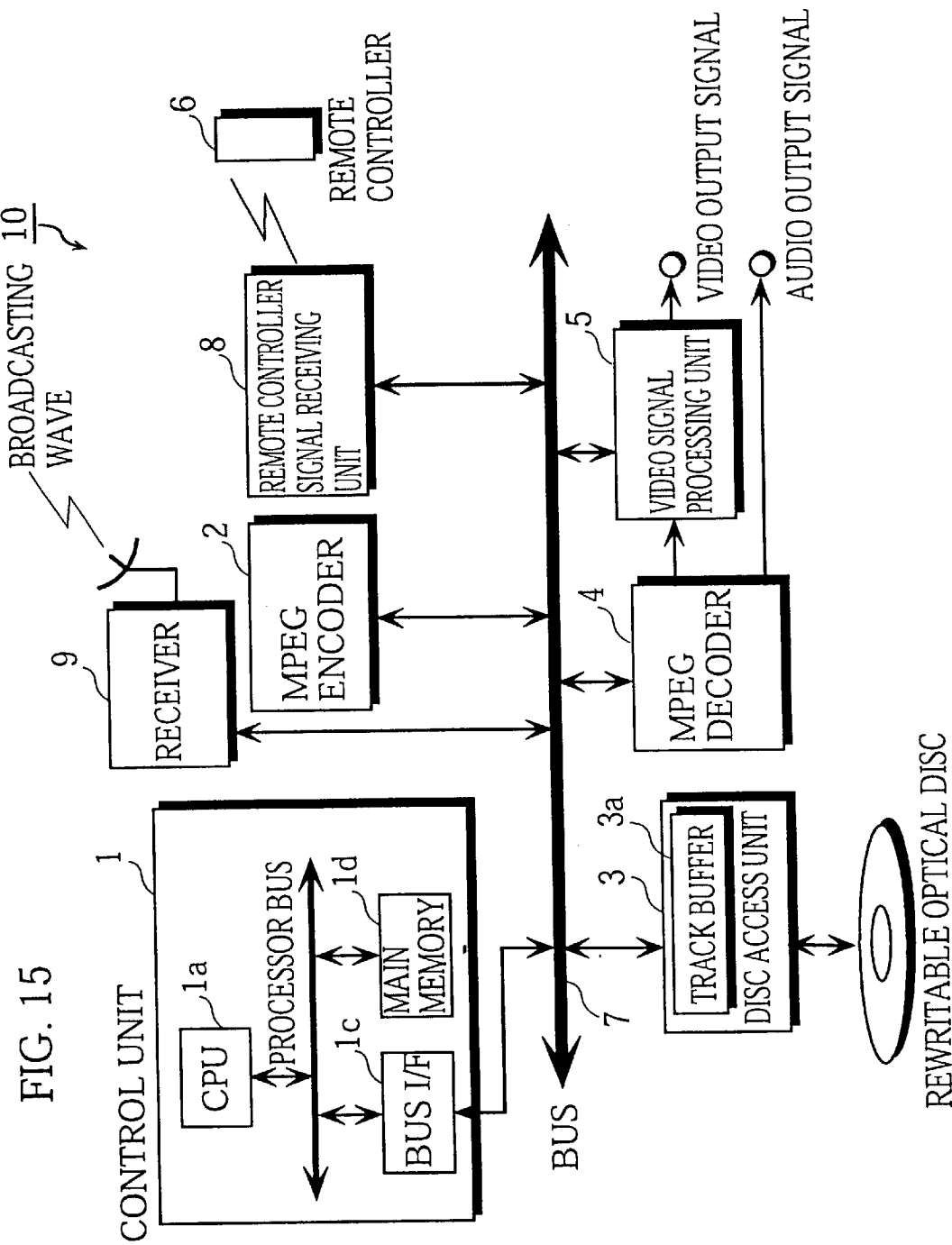
FIG. 15 is a block diagram showing the hardware structure of the DVD recorder 10.
Figure 16:
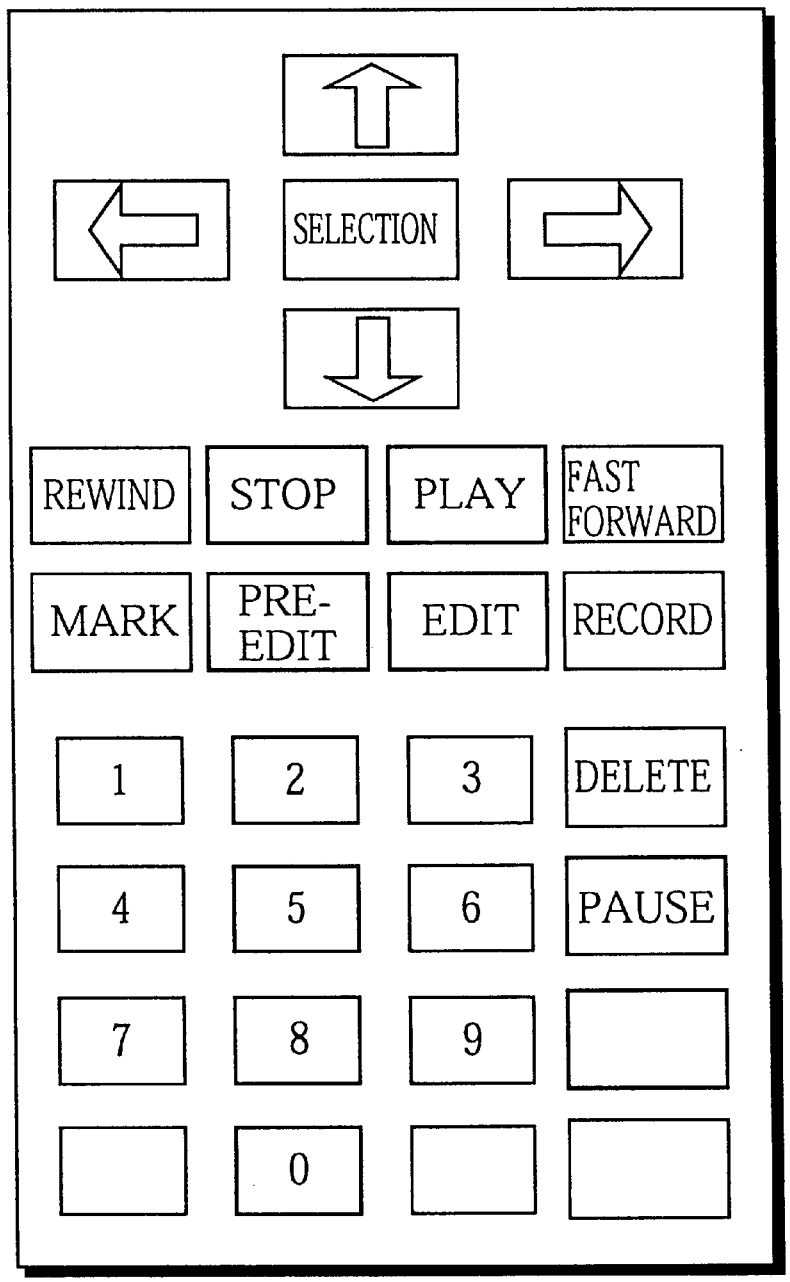
FIG. 16 shows a remote controller.

FIG. 15 is a block diagram showing the hardware structure of the DVD recorder 10.

The DVD recorder 10 includes a control unit 1, an MPEG encoder 2, a disc access unit 3, an MPEG decoder 4, a video signal processing unit 5, a remote controller 6, a bus 7, a remote controller signal receiving unit 8, and a receiver 9.

The control unit 1 includes a CPU1*a*, a processor bus 1*b*, a bus interface 1*c*, and a main memory 1*d*. The control unit 1 executes a program stored in the main memory 1*d* to control the entire DVD recorder 10 in terms of recording, reproducing, editing, etc. Especially, after an AV file (VOB) including AV data is recorded, the control unit 1 generates VOB information and PGC information corresponding to the recorded VOB, and records or updates the AV data management file. Also, when the AV data is reproduced, the control unit 1 obtains, based on the VOB information, the address of a section specified by its start and end times in a cell included in the PGC information in the AV data management file shown in FIG. 9. The control unit then reads out and reproduces the section. Especially, in case of special reproductions, the control unit 1 refers to the VOB information to sequentially obtain addresses of reference pictures which are arranged at intervals of a predetermined period (e.g., 5 seconds or −5 seconds), for fast forwarding or rewinding.

The MPEG encoder 2 compresses the video/audio data which is included in the analog broadcasting waves received through the antenna 11 and generates an MPEG stream.

The disc access unit 3, having a track buffer 3*a*, under the control of the control unit 1, records the MPEG stream received from the MPEG encoder 2 into the DVD-RAM disc via the track buffer 3*a*, reads out the MPEG stream from the DVD-RAM disc, and outputs the read MPEG stream to the MPEG decoder 4 via the track buffer 3*a*.

The MPEG decoder 4 expands the compressed MPEG stream which is read out by the disc access unit 3, and outputs the expanded video data and audio signals.

The video signal processing unit 5 converts the video data output from the MPEG decoder 4 into video signals for the display 12.

The remote controller signal receiving unit 8 receives remote controller signals from the remote controller 6 and informs the control unit 1 of which operation the user has instructed.

The DVD recorder 10 is, as shown in FIG. 14, constructed based on the premise that it is used as a replacement for a VTR used at home. Not limited to the construction, when the DVD-RAM disc is to be used as a recording medium for computers, the following constructions are possible. That is to say, the disc access unit 3 is connected, as a DVD-RAM drive apparatus, to a computer bus via an IF called SCSI or IDE. Also, the components other than the disc access unit 3 shown in FIG. 3 are achieved or operated when the OS and the application program are executed on the computer hardware.

Figure 17:
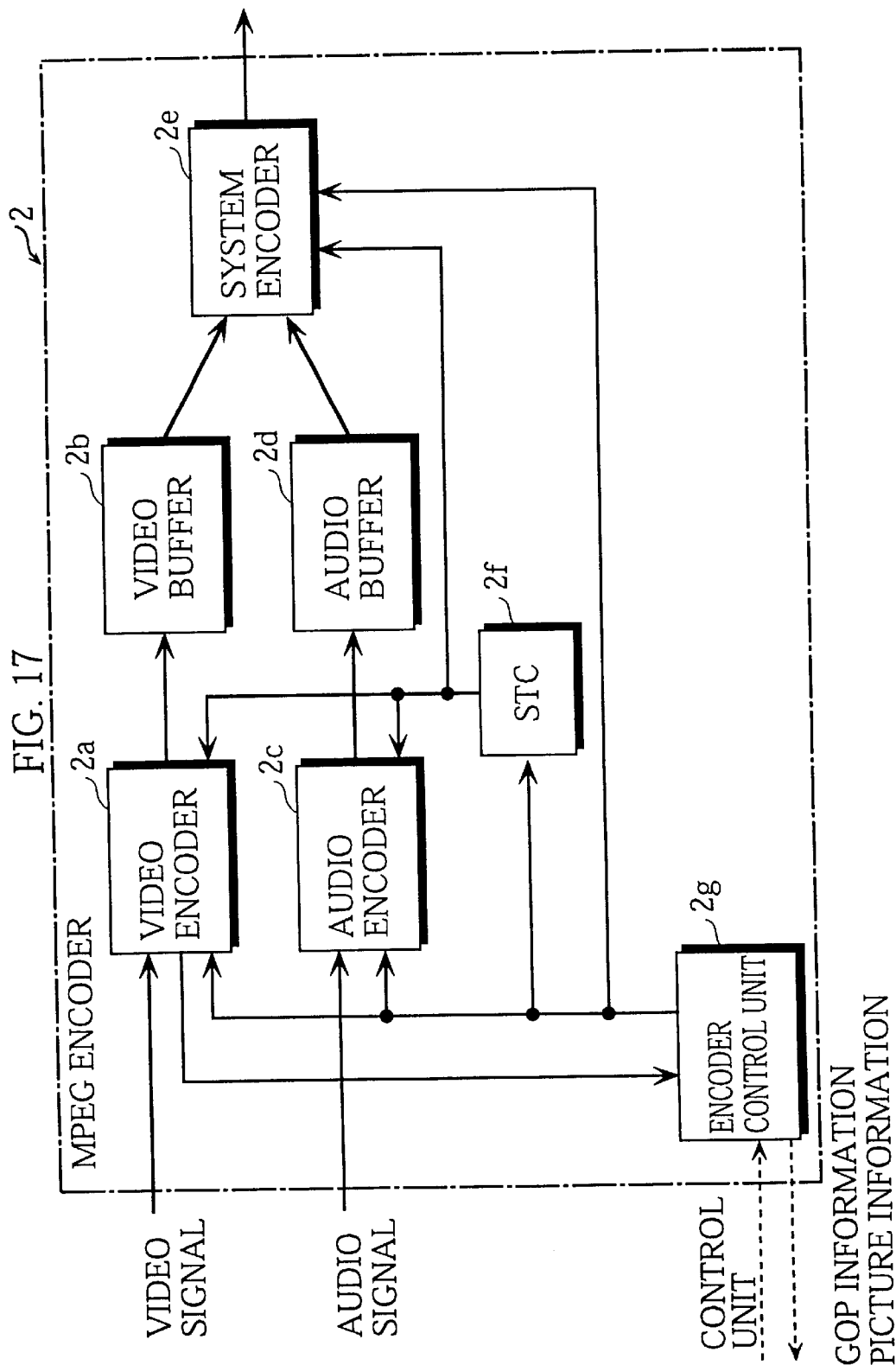
FIG. 17 is a block diagram showing the construction of the MPEG encoder 2.

FIG. 17 is a block diagram showing the construction of the MPEG encoder 2. As shown in the drawing, the MPEG encoder 2 includes a video encoder 2*a*, a video buffer 2*b* for storing the output of the video encoder, an audio encoder 2*c*, an audio buffer 2*d* for storing the output of the audio encoder, a system encode 2*e* for multiplexing the encoded video data and audio data respectively stored in the video buffer 2*b* and the audio buffer 2*d*, an STC (System Time Clock) unit 2*f* for generating sync clock signals for the encoder 2, and an encoder control unit 2*g* for controlling and managing these units.

The encoder control unit 2*g* sends information such as the GOP information and the picture information to the control unit 1 shown in FIG. 15 every time a VOBU is generated in the encoding. Here, the GOP information includes the number of packs in the VOBU and the number of packs in the first I-picture in the VOBU. The packs mentioned here are, for example, video packs (V_PACK) and audio packs (A_PACK) shown in FIG. 10, each having a fixed length of 2 KB. Accordingly, in the present embodiment, the GOP information indicates the number of sectors assigned to the VOBU and the number of sectors assigned to first I-picture in the VOBU.

Figure 18:
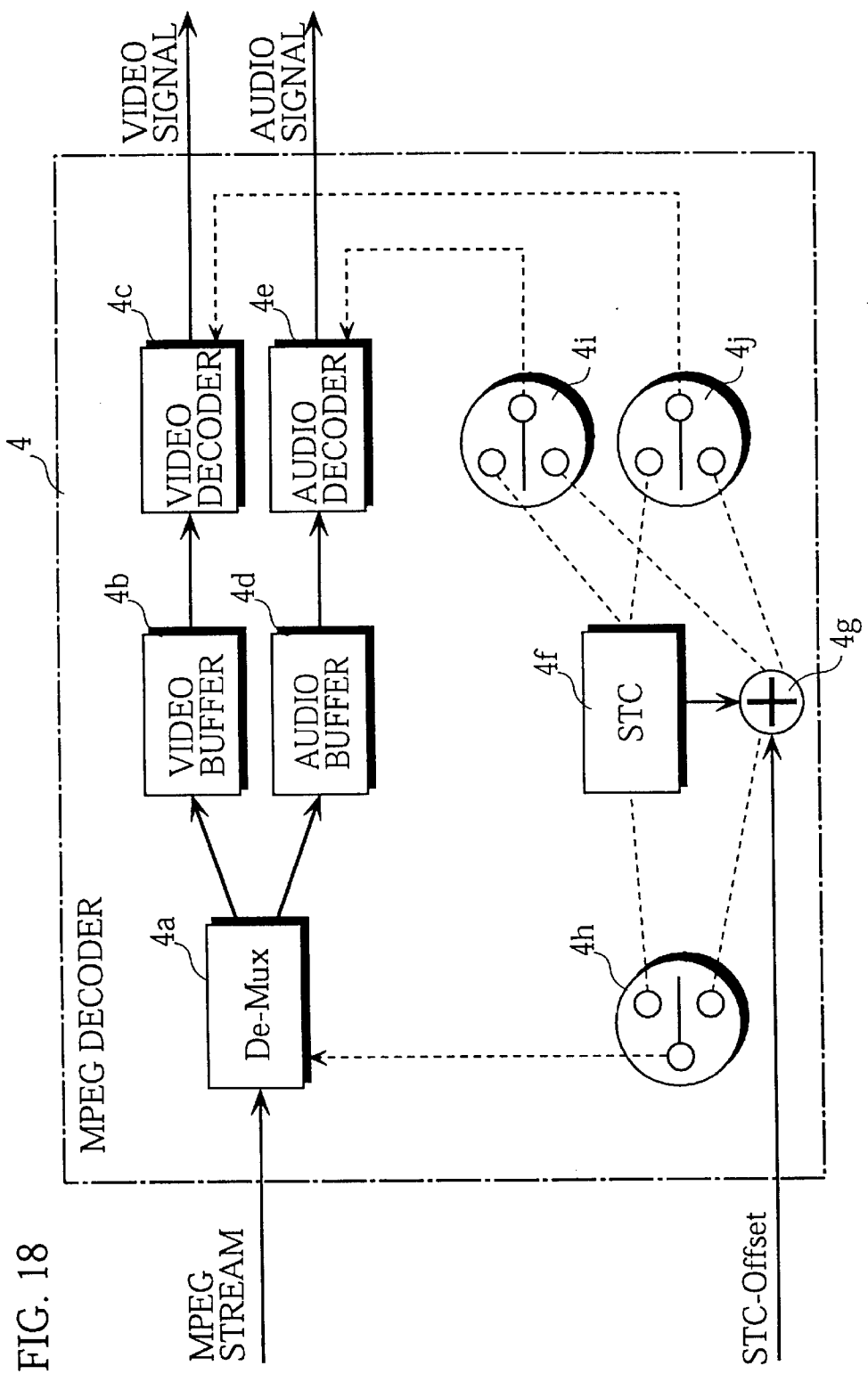
FIG. 18 is a block diagram showing the construction of the MPEG decoder 4.

FIG. 18 is a block diagram showing the construction of the MPEG decoder 4. As shown in the drawing, the MPEG decoder 4 includes a demultiplexor 4a for dividing MPEG streams into video streams and audio streams, a video buffer 4b for temporarily storing the divided video streams, a video decoder 4c for decoding the video streams stored in the video buffer 4b, an audio buffer 4d for temporarily storing the divided audio streams, an audio decoder 4e for decoding the audio streams stored in the audio buffer 4d, an STC (System Time Clock) unit 4f for generating sync clock signals, an adder 4g for adding offset values to the sync clock signals, and selectors 4h–4j for selecting either a sync clock signal or a sync clock signal added with an offset value and supplying the selected signal to the demultiplexor 4a, audio decoder 4e, and video decoder 4c, respectively.

(2-3) Function Block Diagram

Figure 19:
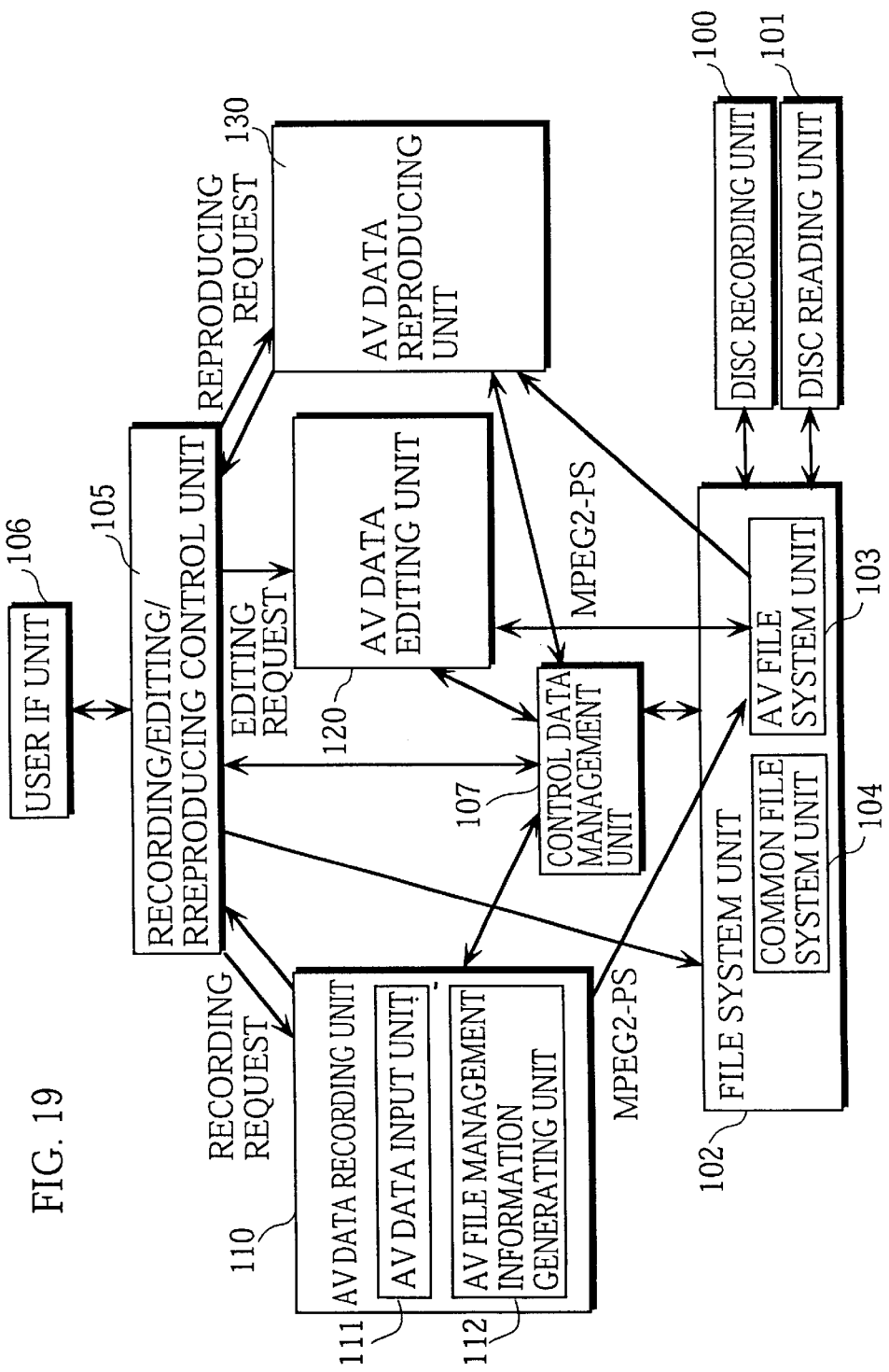
FIG. 19 is a function block diagram showing the construction of the DVD recorder 10 based on the functions of the components.

FIG. 19 is a function block diagram showing the construction of the DVD recorder 10 based on the functions of the components. Each function shown in the figure is achieved after the CPU 1a in the control unit 1 executes the program in the main memory 1d to control the hardware shown in FIG. 15.

As shown in FIG. 19, the DVD recorder 10 is composed of a disc recording unit 100, a disc reading unit 101, a file system unit 102, a recording/ editing/ reproducing control unit 105, a user IF unit 106, a control data management unit 107, an AV data recording unit 110, an AV data editing unit 120, and an AV data reproducing unit 130.

The disc recording unit 100, on receiving a logical sector number and logical data in units of sectors from the file system unit 102, records the received logical data onto the disc. However, in reality, the disc recording unit 100 reads and writes the logical data in units of ECC blocks (each block composed of 16 sectors) from and onto the disc. If the logical data has less than 16 sectors, the disc recording unit 100 reads the ECC block including the logical data, executes the ECC process, then writes the ECC block onto the disc.

The disc reading unit 101, on receiving a logical sector number and the number of sectors from the file system unit 102, reads data from the specified sectors and transfers the read data to the file system unit. However, in reality, the disc reading unit 101 reads data in units of ECC blocks. After the read data is subjected to the ECC process, the disc reading unit 101 transfers only necessary data in sectors to the file system unit. This is because by reading AV data in units of ECC blocks (each block composed of 16 sectors), overhead is reduced. This is the same with the disc recording unit 100.

The file system unit 102 includes an AV file system unit 103 for mainly writing and editing AV files, and a common file system unit 104 for executing processes common to AV files and non-AV files. The file system unit 102, on receiving commands from the AV data recording unit 110, AV data editing unit 120, and AV data reproducing unit 130 in relation to writing or reading files, manages files on the optical disc in units of sectors at the minimum.

The recording/ editing/ reproducing control unit 105 controls the entire DVD recorder 10. More specifically, the control unit 105 controls display of guidance which urges the user to operate, receives instructions from the user reacting to the guidance via the user IF unit 106, and, in accordance with the user instructions, requests the AV data recording unit 110, AV data editing unit 120, or AV data reproducing unit 130 to execute operations such as newly recording of AV data, and reproducing and editing of recorded AV data.

The user IF unit 106 receives instructions for operations from the user via the remote controller 6, and sends the received user instructions to the recording/ editing/ reproducing control unit 105.

The control data management unit 107 reads the AV data management file which is non-AV data from the main memory 1d, and provides information on request from any unit.

The AV data recording unit 110, on receiving a recording request from the control unit 105, issues a command necessary for achieving the recording request to the AV file system unit 103. For this purpose, the AV data recording unit 110 includes an AV data input unit 111 and an AV file management information generating unit 112.

The AV data input unit 111 converts the video and audio signals to MPEG data. That is, the AV data input unit 111 encodes the video and audio signals in realtime. The AV data input unit 111 outputs the encoded MPEG data to the AV file system unit 103 so that the MPEG data is recorded in the disc as an AV file. In encoding the signals, the AV data input unit 111 calculates the number of packs in each VOBU and the number of packs in the first I-picture in each VOBU in the MPEG data, and stores the calculated results in the memory (main memory 1d) as the GOP information. The AV data input unit 111 then sends the information to the AV file management information generating unit 112 after recording the AV files in the disc.

The AV file management information generating unit 112, after an AV file is recorded in the disc by the AV data input unit 111, generates VOB information, PGC information, and a title search pointer corresponding to the recorded AV file based on the GOP information stored in the memory. The generated information is used as AV file management information. The AV file management information generating unit 112 also updates the AV data management file stored in the control data management unit 107, and records the updated AV data management file onto the DVD-RAM disc via the file system unit 102.

The AV data editing unit 120, on receiving an editing request from the control unit 105, issues a command necessary for achieving the editing request to the AV file system unit 103.

The AV data reproducing unit 130, on receiving a reproducing request from the control unit 105, issues a command necessary for achieving the reproducing request to the AV file system unit 103.

(2-4) Commands Executed by File System Unit 102

Following are the commands supported by the file system unit 102.

The file system unit 102 receives various commands from the control data management unit 107, AV data recording unit 110, AV data editing unit 120, AV data reproducing unit 130, and the recording/ editing/ reproducing control unit 105, and manages the files in accordance with the received commands.

FIG. 20 shows a list of commands supported by the AV file system unit 103 and common file system unit 104 for the file management. The operations executed by the file system unit 102 in response to the commands are described below.

CREATE: generate a new file on the disc, and return a file identification descriptor.

DELETE: delete a file from the disc.

OPEN: obtain a file identification descriptor to access file recorded on the disc.

CLOSE: close an opened file.

WRITE: record a file onto the disc.

READ: read a file from the disc.

SEEK: move inside a data stream recorded on the disc.

RENAME: change a file name.

MKDIR: generate a new directory on the disc.

RMDIR: remove a directory from the disc.

STATEFS: inquire about the current state of the file system.

GET-ATTR: obtain an attribute of a file.

SET-ATTR: change an attribute of a currently opened file.

SEARCH DISCON: detect whether a specified section includes a discontinuous boundary (zone boundary), return "TRUE" if it includes the discontinuous boundary; and return "FALSE" if it does not include the discontinuous boundary.

MERGE: merge two pieces of AV data on the disc into data in the memory.

SPLIT: split an AV file on the disc into two AV files.

SHORTEN: delete unnecessary part (an edge part) of an AV file on the disc.

REPLACE: replace a part of an AV file with data in the memory.

The AV data recording unit 110, AV data editing unit 120, and AV data reproducing unit 130 achieve processes such as recording, editing, and reproducing by using combinations of the above commands.

(3) Recording/ Reproducing

Now, the operations of the DVD recorder 10 is describe in detail. The operations are: (3-1) Recording of AV Files, (3-2) Generating and Recording of AV File Management Information, (3-3) Reproduction of AV Data, (3-4) Reproduction by Specified Time, and (3-5) Special Reproduction of AV Data.

(3-1) Recording of AV Files

For recording video/ audio data, a manual recording and a programmed recording are available. The manual recording immediately starts after the user presses the "Record" key on the remote controller and sets a few items for the recording. In the programmed recording, the start and end times of the recording is programmed by the user in advance.

Figure 21:
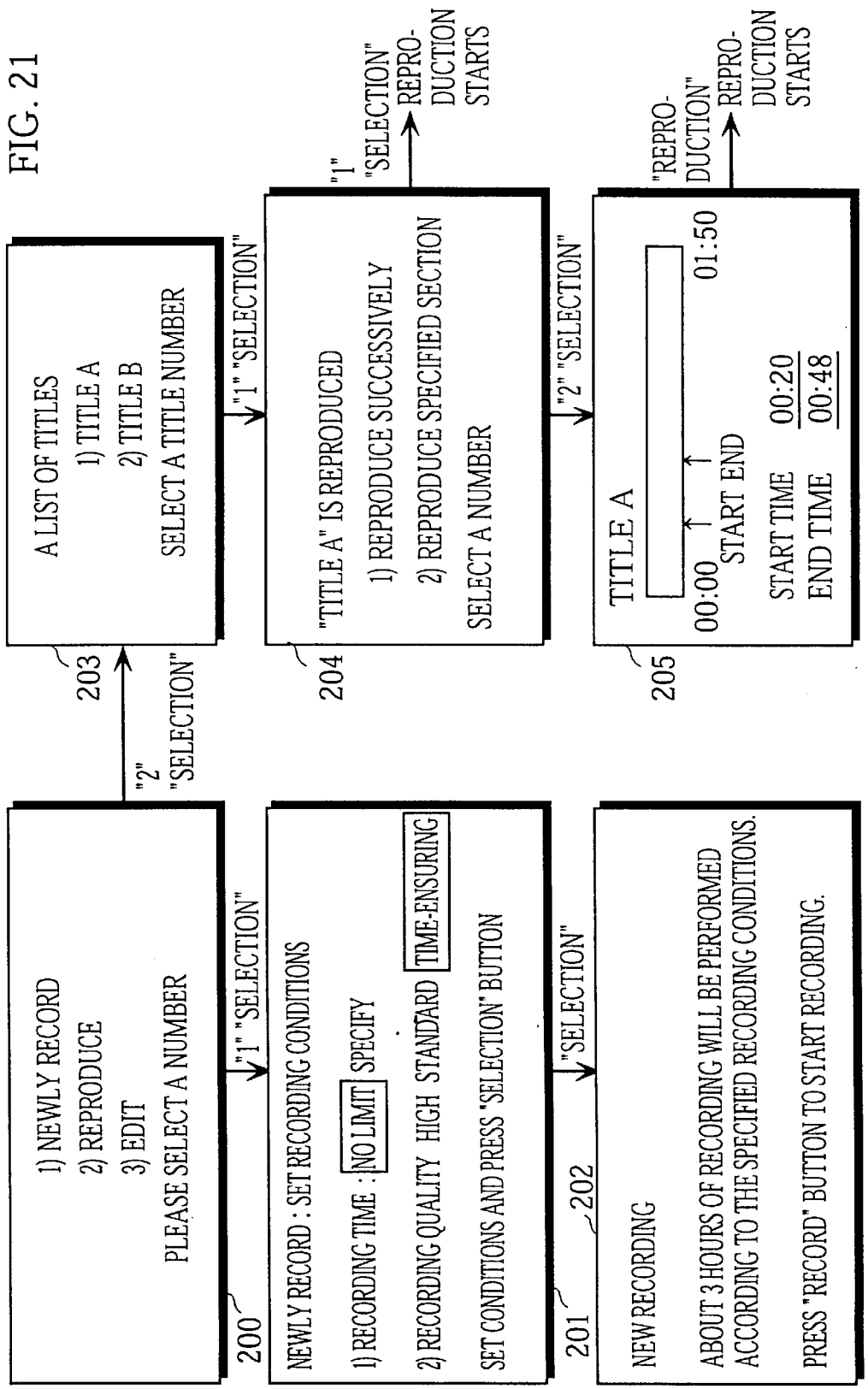
FIG. 21 shows guidance images.

For example, when the user presses the "Record" key on the remote controller 6, the display 12 displays a guidance image 200 as shown in FIG. 21 under the control of the recording/ editing/ reproducing control unit 105. When the user presses "1" and "Selection" keys on the remote controller while the guidance image 200 is displayed on the screen, a guidance image 201 for setting recording conditions (in the present example, the "recording time" and "recording quality") is displayed.

For setting the recording time, the user first moves the focus on the screen onto either "no limit" or "specify" by operating the cursor button on the remote controller 6, then presses "Selection" button. Here, if the user selects "specify," the screen changes to a guidance image for urging the user to input a time by operating the ten key buttons. After the user specifies the time, the screen returns to the guidance image 201.

The "recording quality" as a recording condition relates to the bit rate and resolution of the MPEG data and has three types: "high," "standard," and "time-ensuring." The "high-quality" has a bit rate of 6 Mbps and a resolution of 720*480 pixels; the "standard" has 3 Mbps and 360*480 pixels; and the "time-ensuring" quality has 1.5 Mbps and 360*240 pixels.

Here, suppose the user selects "no limit" and "time-ensuring" quality on the guidance image 201, and then presses the "Record" button on the guidance image 202.

Figure 22:
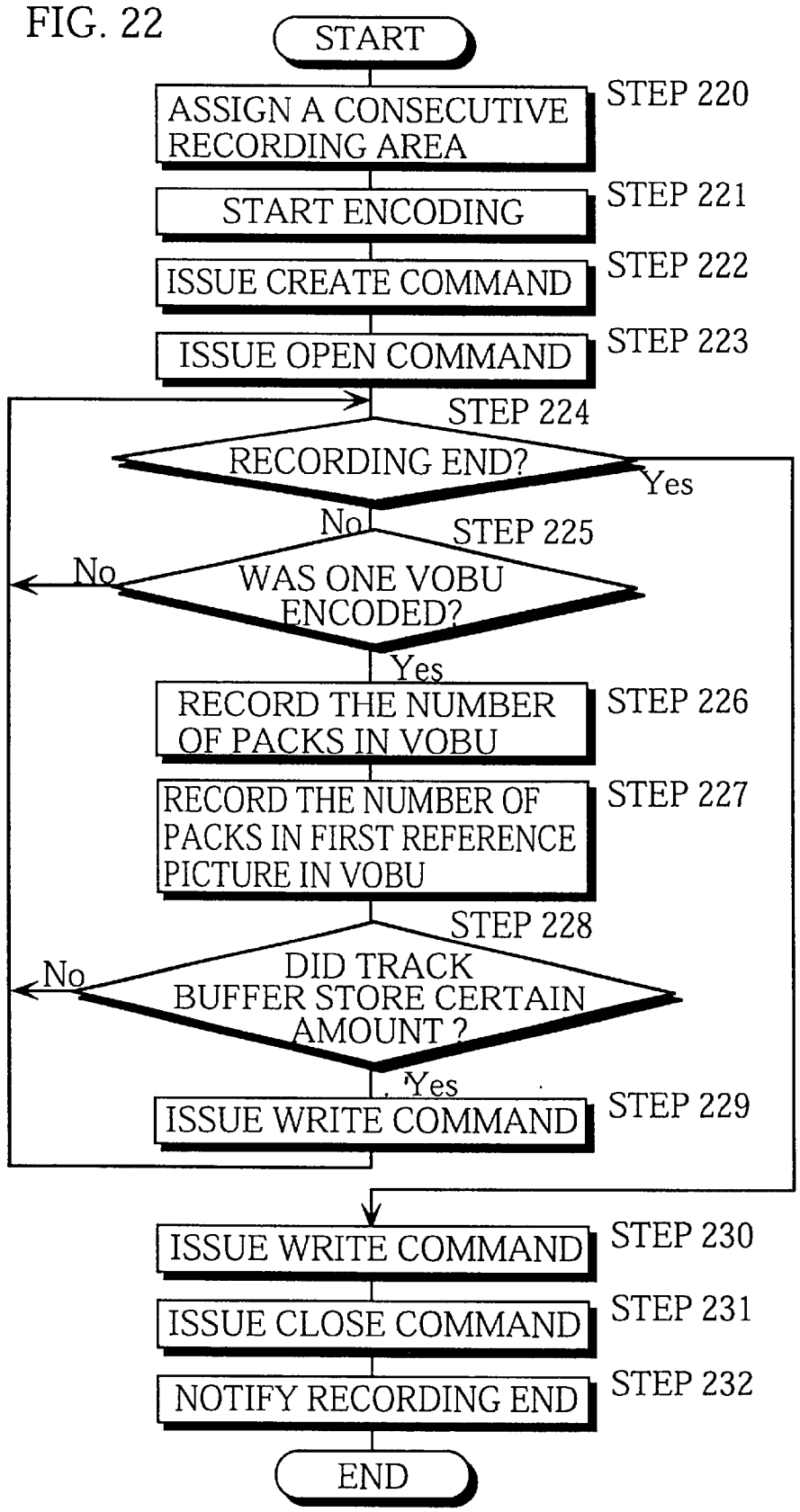
FIG. 22 is a flowchart showing the recording process performed by the AV data recording unit 110.

When such selections are made, the recording/ editing/ reproducing control unit 105 instructs the AV data recording unit 110 to record as specified. On receiving the instruction, the AV data recording unit 110 starts a recording process. FIG. 22 is a flowchart showing the recording process performed by the AV data recording unit 110.

In case of a manual recording, a notification that the user has pressed the "Record" button is sent to the recording/ editing/ reproducing control unit 105 via the user IF unit 106.

On receiving the notification, the control unit 105 assigns a consecutive recording area having a size greater than the predetermined size (about 7 MB) which has been described earlier (step 220). More specifically, the control unit 105 refers to the space bit map and the consecutive recording area management table to detect not-assigned consecutive sector areas. The control unit 105 then assigns a new consecutive recording area composed of the not-assigned consecutive sector areas to the recording. In doing so, when other AV data has already been recorded in the disc and when the AV data to be recorded continues from the existent AV data logically, the control unit 105 assigns a consecutive recording area that continues from the already-assigned consecutive recording area of the existent AV data, if it is possible.

The recording/ editing/ reproducing control unit 105 sends a file identifier and a parameter indicating the "time-ensuring" quality specified as the recording condition to the AV data input unit 111. The AV data input unit 111 instructs the MPEG encoder 2 to start encoding the video and audio data of a predetermined channel received through the antenna 11 and to start transferring the encoded MPEG data to the track buffer 3a (step 221).

The recording/ editing/ reproducing control unit 105 issues the CREATE command specifying the newly assigned consecutive recording area to the common file system unit 104 (step 222). On receiving the command, the common file system unit 104 returns the file identification descriptor when it is possible to create a file in the newly assigned consecutive recording area.

While the above process is proceeding, the AV data input unit 111 issues the OPEN command to the AV file system unit 103 (step 223) to allow the AV file system unit 103 to store the file identification descriptor given by the control unit 105 and information on the file entry into a work memory (not illustrated) (the information stored in the work memory is also referred to as "Fd" (File descriptor).

The AV data input unit 111 calculates and stores the number of packs in each VOBU and the number of packs in the first reference picture (I-picture) in each VOBU into the main memory 1d as the GOP information each time a VOBU is encoded. The AV data input unit 111 continues to perform this process until it receives a stop instruction from the control unit 105 (step 224). FIG. 23 shows an example of the GOP information. The drawing shows the GOP information stored in the main memory 1d at the time VOBUs up to VOBU #22 have been encoded. It should be noted here that in the present embodiment, each VOBU includes video data of 15 frames (or 30 fields) which correspond to about 0.5 seconds of reproduction.

Furthermore, the AV data input unit 111 issues the WRITE command to the AV file system unit 103 every time the track buffer 3a stores a predetermined amount of MPEG data (steps 228 and 229). Here, it is presumed that the WRITE command is issued to the system unit 103 together with three parameters specified. The three parameters respectively indicate: the Fd having been opened by the OPEN command as described above; the size of data to be recorded; and a buffer (in this embodiment, the track buffer 3a) storing the data. The Fd specified by the parameter includes, as the file entry does, information of a storage position of an extent and a length of the extent. The information represents the consecutive recording area assigned in the step 220. The Fd is updated every time a write is issued during the period between the opening and closing of the Fd. For the second or a subsequent issue of the WRITE command, new data is additionally written, following the already-recorded data.

On receiving the stop instruction (step 224), the AV data input unit 111 issues the WRITE command (step 230). The AV data input unit 111 then issues the CLOSE command (step 231). The AV data input unit 111 further informs the AV file management information generating unit 112 that a recording of an AV file (VOB) has ended (step 232) to end the entire process. Note that the WRITE command is issued in step 230 to record onto the disc the rest of the data in the track buffer. Also, the CLOSE command issued in step 231 is a command used to write back the Fd from the work memory onto the DVD-RAM disc as a file identifier, a file entry or the like on the DVD-RAM disc.

In the example shown in FIG. 23, a manual recording case is described. In case of the programmed recording, a notification that the "Record" button has been pressed is sent to the recording/ editing/ reproducing control unit 105 via the user IF unit 106 together with a time specified for the programmed recording. The control unit 105 assigns a consecutive recording area corresponding to the specified time period.

(3-2) Generating and Recording of AV File Management Information

Figure 24:
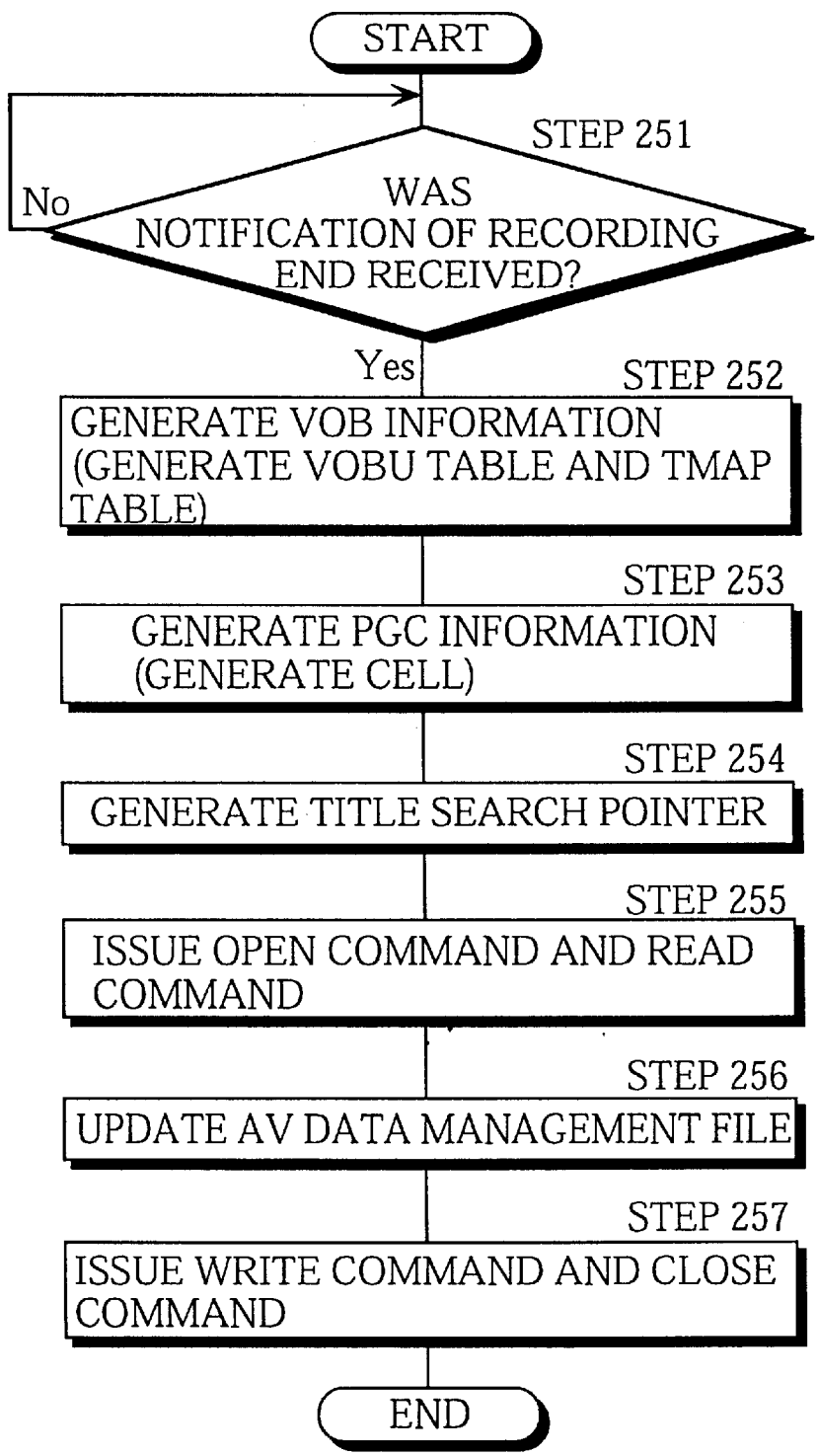
FIG. 24 is a flowchart showing the process of generating and recording the AV file management information by the AV file management information generating unit 112.

FIG. 24 is a flowchart showing the process of generating and recording the AV file management information by the AV file management information generating unit 112.

As shown in the drawing, the AV file management information generating unit 112, on receiving from the AV data input unit 111 a notification that a recording of an AV file has ended (step 251), generates the VOB information based on the GOP information stored in the memory (main memory 1*d*) by the AV data input unit 111 and also based on the VOBU numbers corresponding to the start address of the newly assigned consecutive recording area storing the AV file (step 252). (a) The VOB general information the time map information including, as shown in FIG. 11, (b) time map general information, (c) VOBU table, and (d) time map table are generated as follows.

(a) VOB General Information (VOB Identifier, VOB Reproduction Time)

When an file management table has already been held in the control data management unit 107, the AV file management information generating unit 112 assigns a not-assigned VOB identifier (e.g., the next VOB identifier). When a file management table has not been held in the control data management unit 107, the AV file management information generating unit 112 assigns VOB #1 as the VOB identifier, obtains the reproduction time of the AV file from the AV data input unit 111, and generates the VOB general information which includes these kinds of information.

(b) Time Map General Information (Number of Time Maps, Number of VOBU Maps, TMU, TM_OFS)

The AV file management information generating unit 112 calculates the number of time maps by dividing the VOB reproduction time by the TMU which is set to 60 seconds, for example. The AV file management information generating unit 112 then sets the number of VOBU maps to the number of VOBUs included in the GOP information, and sets the TM_OFS to "0" (in case of a new recording).

(c) VOBU Table (Reference Picture Size, VOBU Reproduction Time, VOBU Size)

Since the GOP information shown in FIG. 23 directly shows the reference picture sizes and VOBU sizes, the AV file management information generating unit 112 adds the reproduction time of each VOBU to the GOP information to generate the VOBU table. In the present embodiment, since each VOBU includes video data of 15 frames (or 30 fields), each VOBU is reproduced for about 0.5 seconds (for 15 frame time periods). It should be noted here that since the reproduction time of the last VOBU in the AV file is different from the other VOBUs, the AV file management information generating unit 112 obtains the reproduction time of the last VOBU from the AV data input unit 111 to set the obtained time in the VOBU table.

(d) Time Map Table (VOBU Map Number, Time Difference TM_DIFF, and VOBU Address)

The AV file management information generating unit 112 adds up the VOBU reproduction times in the VOBU table in sequence. Every time the addition result matches a time which is an integral multiple of the TMU, the AV file management information generating unit 112 detects a VOBU that corresponds to the time. In this way, the AV file management information generating unit 112 obtains the VOBU map number corresponding to each time map, and obtains the time difference TM_DIFF from the equation:

TM_DIFF=(integral multiple of TMU)−(summation).

The VOBU addresses are obtained by adding each VOBU size up to the "VOBU map number" to the start address of the consecutive recording area, the start address being obtained from the AV data input unit 111.

After generating the VOB information as described above, the AV file management information generating unit 112 generates the PGC information of the title recorded by the AV data input unit 111 (step 253). In a programmed recording, the AV data input unit 111 generates one VOBU. In such a case, the PGC information includes a single cell specifying the start time and end time of a VOB.

When the user pauses a recording, it is desirable that the different cells are generated to specify different reproduction periods before and after the pause. This is because the AV data input unit 111 (MPEG encoder 2) comes to a full stop and that it is an important gap between images to the user. When this happens, the AV file management information generating unit 112 generates two or more cells by obtaining the times at which the pauses start.

Also, the AV file management information generating unit 112 generates the title search pointer that indicates the generated PGC information (step 254).

The AV file management information generating unit 112 then issues the OPEN command and the READ command to the file system unit 102 to read an AV data management file if the file already exists (step 255). However, the AV data management file may not be read when the control data management unit 107 holds the file.

The AV file management information generating unit 112 updates the read AV data management file by adding the VOB information, the PGC information, and the title search pointer generated in the steps 252–254 to the AV data management file (step 256). The AV file management information generating unit 112 then issues the WRITE command and the CLOSE command to the file system unit 102 to record (write) the updated AV data management file onto the disc (step 257). With this operation, the process of generating and recording the AV file management information ends. Here, an area is assigned to the AV data management file in units of sectors since the AV data management file is non-AV file.

Figure 25:
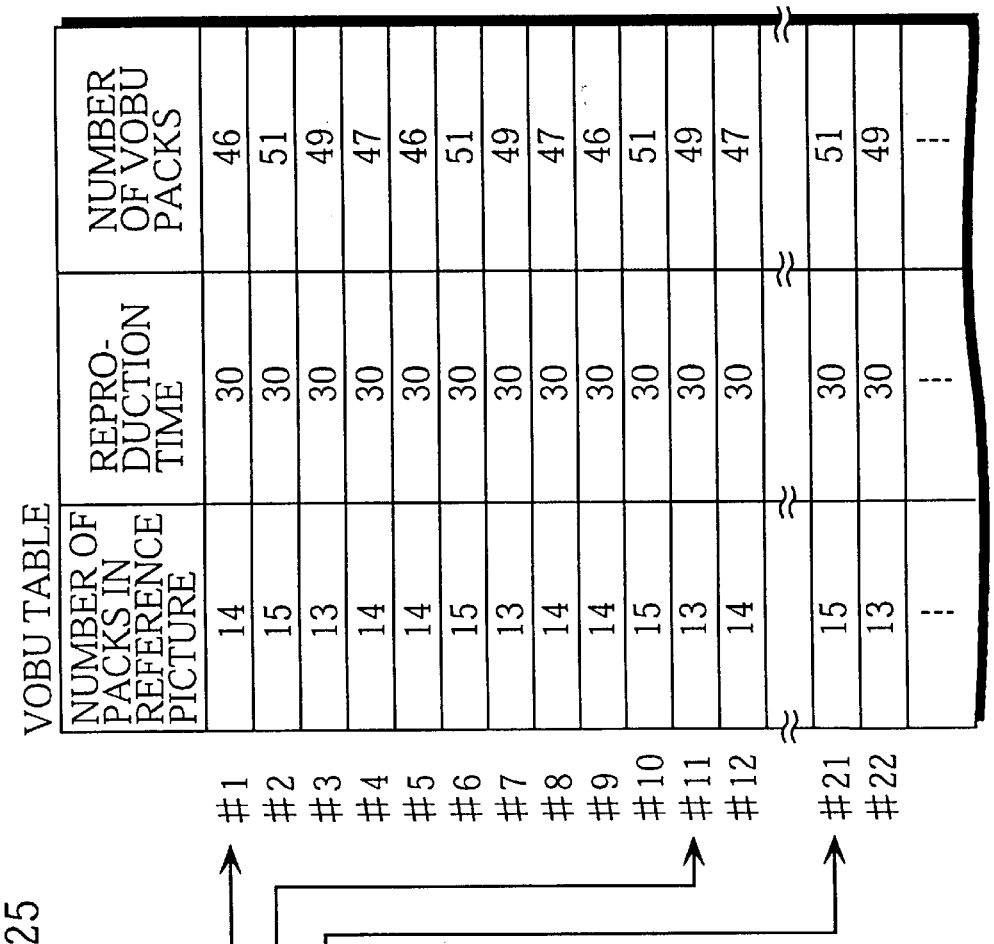
FIG. 25 shows a time map table and a VOBU table generated based on the GOP information.

FIG. 25 shows a time map table and a VOBU table generated based on the GOP information shown in FIG. 23. In the figure, the TMU is set to 5 seconds for the sake of conveniences. Also, the VOBU reproduction time is represented by the number of field times (1/60 seconds).

(3-3) Reproduction of AV Data

In the reproduction process, the guidance image 203 shown in FIG. 21 is displayed when the user presses "2" and "Selection" buttons on the remote controller while the guidance image 200 is displayed. When the user presses "1" and "Selection" buttons while the guidance image 203 is displayed, the control unit 105 sends a title name (or a title search pointer number) to the AV data reproducing unit 130. In the present example, this lets the title A be produced.

Figure 26:
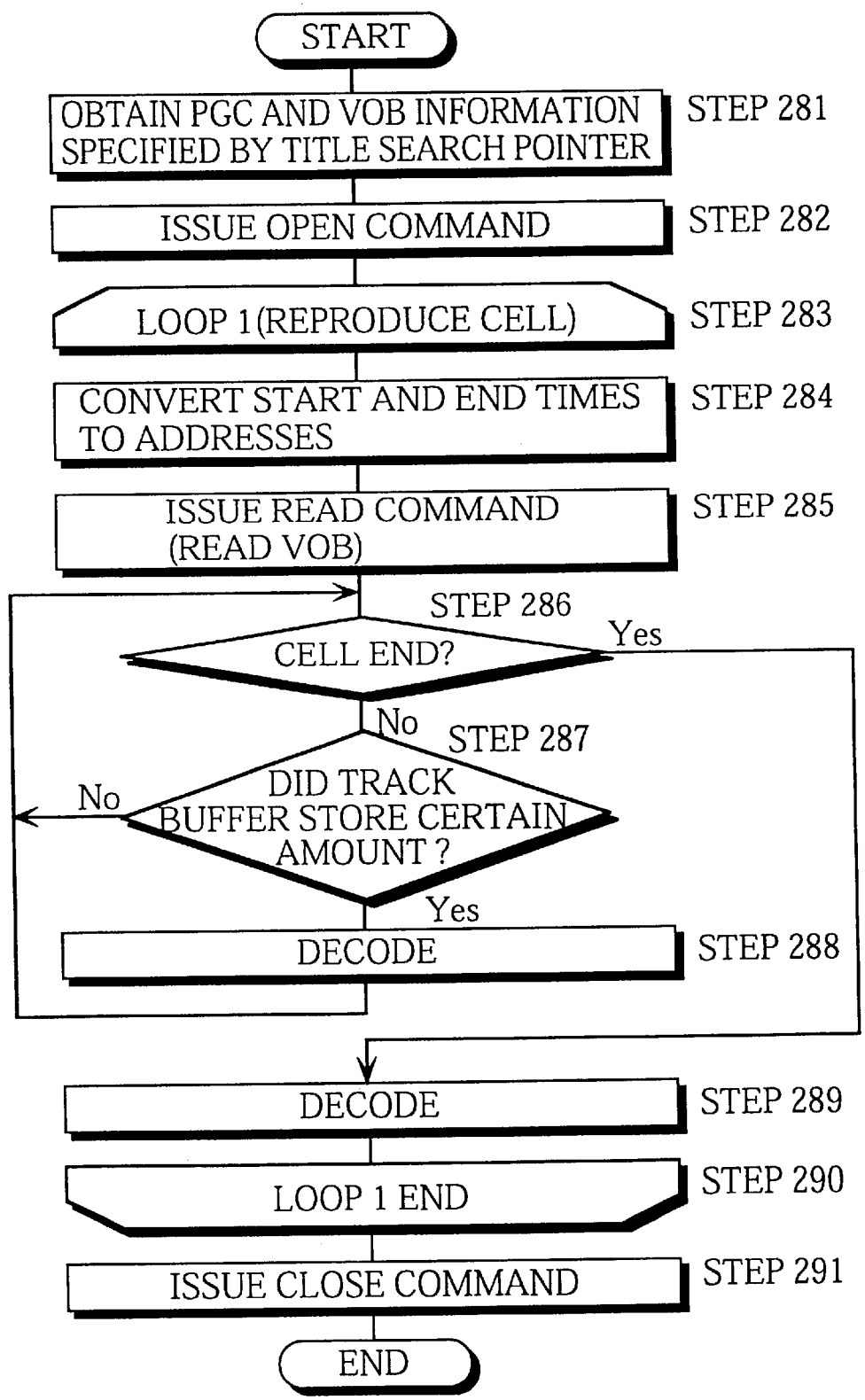
FIG. 26 is a flowchart showing the process of an ordinary reproduction performed by the AV data reproducing unit 130.

FIG. 26 is a flowchart showing the process of an ordinary reproduction performed by the AV data reproducing unit 130.

In FIG. 26, the AV data reproducing unit 130 refers to the AV data management file held by the control data management unit 107 for the sent title name (or title search pointer number) to obtain the PGC information and the VOB information (step 281). Also, the AV data reproducing unit 130 issues the OPEN command specifying an AV file shown in the obtained VOB information to the file system unit 102 (step 282).

The AV data reproducing unit 130 then reproduces the title A by repeating a loop ranging from the step 283 to 290 the same number of times as the number of cells set in the PGC information.

More specifically, the AV data reproducing unit 130 converts the start and end times of the cell to the start address (sector address) and the end address respectively by referring to the time map information (step 284). The AV data reproducing unit 130 issues the READ command specifying the times to the file system unit 102. This allows the disc reading unit 101 to start reading the data section in the VOB (corresponding to the cell) between the start and end addresses.

The AV data reproducing unit 130 then decodes AV data in the track buffer 3a each time the track buffer 3a stores a predetermined amount of AV data until the reading of the current cell ends (steps 286–288). When the disc reading unit 101 ends reading the cell, the AV data reproducing unit 130 decodes data in the track buffer 3a (step 289). The reproduction of the cell ends with the step.

After all the cells shown in the PGC information are decoded through the process described above, the AV data reproducing unit 130 issues the CLOSE command to the file system unit 102 to end the reproduction process.

(3-4) Reproduction by Specified Time

The "reproduction by specified time" is a reproduction performed when the user specifies the start time and end time within the range of the reproduction period of the title on the guidance image 205 shown in FIG. 21.

Figure 27:
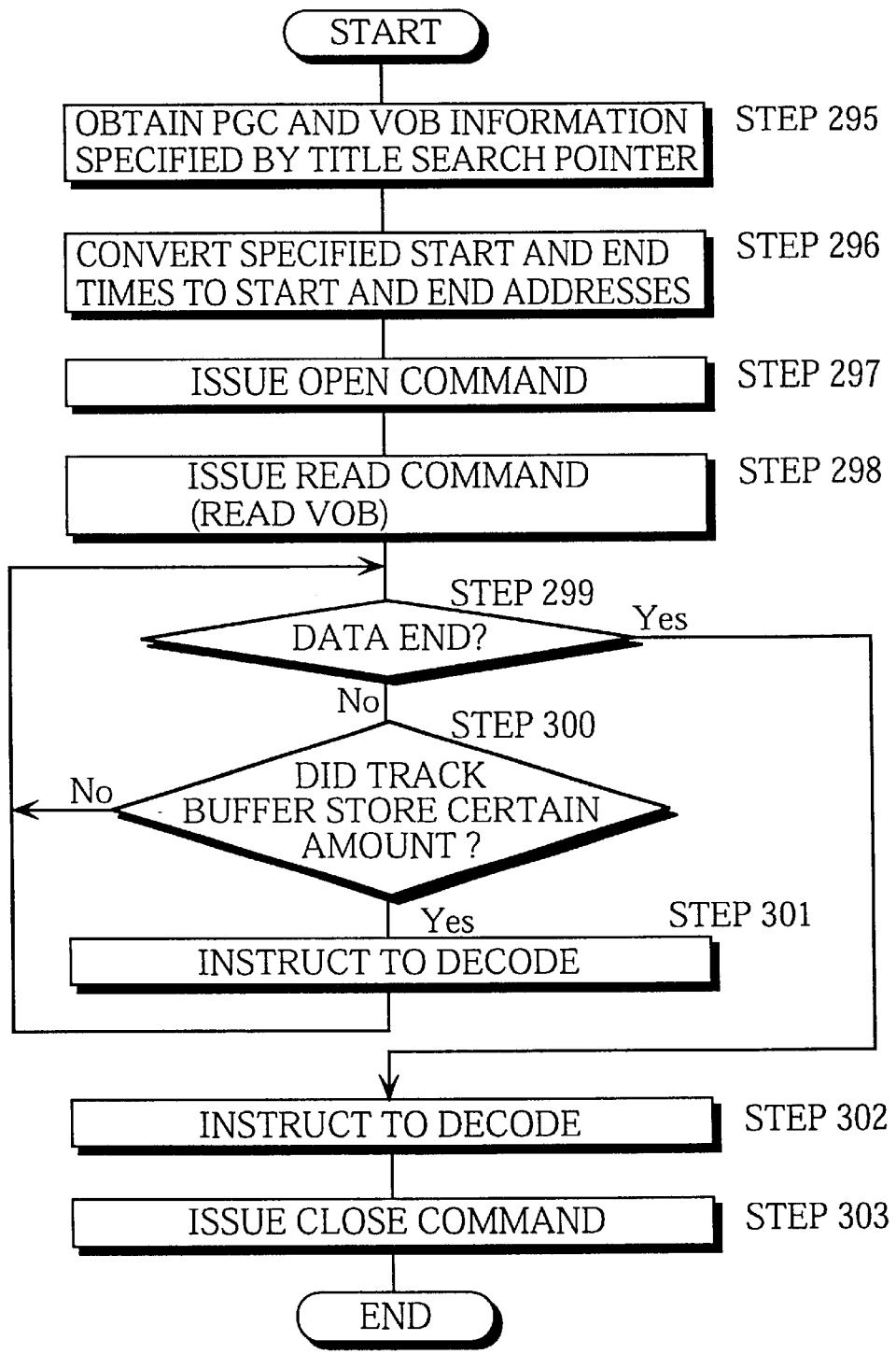
FIG. 27 is a flowchart showing the reproduction process performed when the user specifies the start and end times in a title.

FIG. 27 is a flowchart showing the process of the reproduction by specified time.

In FIG. 27, the AV data reproducing unit 130 refers to the AV data management file held by the control data management unit 107 for the sent title name (or title search pointer number) to obtain the PGC information and the VOB information (step 295). The AV data reproducing unit 130 further converts the start and end times specified by the user to the start address and the end address respectively by referring to the time map information (step 296).

The AV data reproducing unit 130 issues the OPEN command specifying an AV file shown in the obtained VOB information to the file system unit 102 (step 297). The AV data reproducing unit 130 also issues the READ command specifying the obtained start and end addresses to the file system unit 102. This allows the disc reading unit 101 to start reading the data section in the VOB between the start and end addresses.

The AV data reproducing unit 130 then decodes AV data in the track buffer 3a each time the track buffer 3a stores a predetermined amount of AV data until the reading of the current cell ends (steps 299–301). When the disc reading unit 101 ends the reading, the AV data reproducing unit 130 decodes data in the track buffer 3a (step 302), and issues the CLOSE command to the file system unit 102 (step 303). The reproduction process ends with the step.

(3-5) Special Reproduction of AV Data

The special reproduction process starts when the user presses the "Fast Forward" key or the "Rewinding" key on the remote controller 6, and ends when the user presses the "Play" key in the reproduction process shown in FIGS. 26 and 27.

FIG. 28 is a flowchart showing the process of the special reproduction performed by the AV data reproducing unit 130.

The AV data reproducing unit 130, on receiving a notification from the recording/ editing/ reproducing control unit 105 that the user has pressed the "Fast Forward" or "Rewinding" key, sets a skip time Δt for special reproduction (step 310). For example, the skip time Δt is set to "+1 second" for the "Fast Forward" key, and "−1 second" for the "Rewinding" key. The skip time Δt may be extended respectively by "+1 second" and "−1 second" when the "Fast Forward" or "Rewinding" key is pressed during the special reproduction.

In the subsequent steps, the AV data reproducing unit 130 pauses the MPEG decoder 4, obtains the pause time "ts" from the MPEG decoder 4, and clears the track buffer 3a (steps 311–313).

The AV data reproducing unit 130 then executes the process ranging from the step 315 to step 325 every time the pause time "ts" is updated using the skip time Δt until an instruction end the special reproduction (e.g., pressing of the "Play" key) is entered.

More specifically, when the updated time "ts" does not exceed the end time of the cell being reproduced, the AV data reproducing unit 130 refers to the time map information to identify a VOBU map that corresponds to the time "ts" (step 318), calculates the start address of the VOBU map by referring to the corresponding time map and the VOBU, and reads the reference picture size from the identified VOBU map (step 319). When the updated time "ts" exceeds the end time of the currently reproduced cell and when there is a next cell, the AV data reproducing unit 130 updates the time "ts" to a time exceeding the start time of the next cell by a time obtained from a certain formula (steps 315–317), then obtains the start address of the VOBU and the reference picture size described above.

The AV data reproducing unit 130 issues a SEARCH_DISCON_AV_BLK command to the file system unit 102 specifying the obtained start address and the reference picture size indicating a data section (step 320). This command is issued to check whether a reference picture recording area outsteps a boundary such as a boundary between zones, that is, whether a reference picture recording area is a consecutive area or a discontinuous area (step 320). When it is judged that the area is discontinuous, the AV data reproducing unit 130 detects a VOBU map adjacent to the current VOBU (step 322), and reads the start address and the reference picture size (step 323).

The AV data reproducing unit 130 issues the READ command specifying the read start address and reference picture size to the file system unit 102 (step 324). On receiving the command, the file system unit 102 stores the reference picture data specified by the command into the track buffer 3a. The reference picture data is then reproduced by the MPEG decoder 4.

The above-described process is repeated until an instruction to end the special reproduction is entered, with the time "ts" being updated by the skip time Δt in each of the repeated processes. When the instruction to end the special reproduction is entered (step 325), the AV data reproducing unit 130 ends the special reproduction process and returns to a former normal reproduction, that is, to step 283 shown in FIG. 26 or step 296 shown in FIG. 27 (step 326). In doing this, the time "ts" is set to the start time of the normal reproduction.

As described above, reference picture addresses corresponding to times which differ by the skip time are sequentially obtained in accordance with the time map information. Furthermore, the time map information includes the time map table and the VOBU table in a hierarchical structure in which the reproduction times of all the VOBUs and their storage positions (sector addresses) are related to each other. With this construction, it is unnecessary for the disc to record the reproduction times and storage positions (sector addresses) of all the VOBUs. This reduces the amount of data to be recorded in one disc, enabling video/audio data to be reproduced in realtime while the video/audio data is recorded onto the disc.

In the present embodiment, as shown in FIG. 14, the DVD recorder 10 is constructed based on the premise that it is used as a replacement for a VTR used at home. However, not limited to the construction, when the DVD-RAM disc is to be used as a recording medium for computers, the following constructions are possible. That is to say, the disc access unit 3 is connected, as a DVD-RAM drive apparatus, to a computer bus via an IF called SCSI or IDE. Also, the components other than the disc access unit 3 are achieved or operated when the OS and the application program are executed on the computer hardware. In this case, the disc recording unit 100, disc reading unit 101, and file system unit 102 are mainly achieved as applications for enhancing the OS or the functions of the OS. Also, the other components other than these are mainly achieved as functions of the application programs. The various commands supported by the file system unit 102 are equivalent to service commands, such as a system call command, provided to the applications.

In the present embodiment, it is described that each AV file records one VOB. However, one AV file may record a plurality of VOBs. This is achieved, for example, by an arrangement in which the AV data management file (RTRW.IFO) records and manages size of each VOB included in AV files or offset addresses of the VOBs from the start of the corresponding AV file.

The reference picuture size may be defined as the end address of the video pack in which the final data of the first encoded reference picture (the first I-picture) of this VOBU is recorded. The end address is measured by the relative in-file sector address from the first sector of this VOBU.

While the present invention has been fully described, various changes and modifications are of course possible without departing from the scope of the present invention.

What is claimed is:

1. An optical disc comprising:
   a data area operable to store a video object including a plurality of video object units;
   a time map area operable to store time map information;
   a first time table, included in the time map information and associated with the video object, including a plurality of first entries associated with a corresponding plurality of video object units which constitute fewer than the entirety of the video object units of the video object, wherein each first entry includes an address of a corresponding video object unit and an indicator for specifying the corresponding video object unit; and
   a second time table, included in the time map information and associated with the video object, including a plurality of second entries associated with the plurality of video object units of the video object, wherein each second entry is associated with a respective video object unit and includes a reproduction time and a data size of the respective video object unit.

2. An optical disk as claimed in claim 1, wherein said data area is operable to store a plurality of video objects, said optical disc comprising:
   a plurality of said first time table, each associated with a respective one of the plurality of video objects and including a plurality of first entries, associated with a corresponding plurality of video object units which constitute fewer than the entirety of the video object units of the respective video object, wherein each first entry includes an address of a corresponding video object unit in the respective video object and an indicator for specifying the corresponding video object unit in the respective video object; and
   a plurality of said second time table, each associated with a respective one of the plurality of video objects and including a plurality of second entries associated with the plurality of video object units of the respective video object, wherein each second entry is associated with a respective video object unit in the respective video object and includes a reproduction time and a data size of the respective video object unit in the respective video object.

3. An optical disc as claimed in claim 2, wherein said first entries indicate storage positions of video object units, in the respective video object, corresponding to reproduction points that differ by a predetermined time unit that is longer than a maximum reproduction period of a video object unit.

4. An optical disc as claimed in claim 3, wherein each of the first entries further includes difference information indicating a difference between a corresponding one of the reproduction points and a reproduction start time of the respective video object unit.

5. An optical disc as claimed in claim 2, wherein the time map information further includes the number of first entries in each first time table and the number of second entries in each second time table.

6. An optical disc as claimed in claim 1, wherein said first entries indicate storage positions of video object units corresponding to reproduction points that differ by a predetermined time unit that is longer than a maximum reproduction period of a video object unit.

7. An optical disc as claimed in claim 6, wherein each of the first entries further includes difference information indicating a difference between a corresponding one of the reproduction points and a reproduction start time of the video object unit.

8. An optical disc as claimed in claim 1, wherein the time map information further includes the number of first entries in said first time table and the number of second entries in said second time table.

9. A recording apparatus, for use with an optical disc, said recording apparatus comprising:

an input device operable to receive video data in a time series;

a compression device operable to compress the received video data so as to generate a video object which includes a sequence of video object units;

a writing device operable to write the video object onto the optical disc; and a controller operable to generate a first time table and a second time table, and to control said writing device to write the generated video object, the generated first time table, and the generated second time table onto the optical disc;

wherein said controller is operable to generate said first time table so as to include a plurality of first entries associated with a corresponding plurality of video object units which constitute fewer than the entirety of the video object units of the video object, such that each first entry includes an address of a corresponding video object unit and an indicator for specifying the corresponding video object unit, and said controller is operable to generate said second time table so as to include a plurality of second entries associated with the video object units of the video object such that each second entry is associated with a respective video object unit and includes a reproduction time and a data size of the respective video object unit.

10. A recording apparatus as claimed in claim 9, wherein said compression device is operable to generate a plurality of video objects, said writing device is operable to write the plurality of video objects onto the optical disc, and said controller is operable to generate:

a plurality of said first time table, each associated with a respective one of the plurality of video objects, so as to include a plurality of first entries associated with a corresponding plurality of vide object units which constitute fewer than the entirety of the video object units of the respective video object, such that each first entry includes an address of a corresponding video object unit in the respective video object and an indicator for specifying the corresponding video object unit in the respective video object; and a plurality of said second time table, each associated with a respective one of the plurality of video objects, so as to include a plurality of second entries associated with the video object unit of the respective video object, such that each second entry is associated with a respective video object unit in the respective video object and includes a reproduction time and a data size of the respective video object unit in the respective video object.

11. A recording apparatus as claimed in claim 10, wherein said controller is operable to generate the first entries such that the first entries indicate storage positions of video object units, in the respective video object, corresponding to reproduction points that differ by a predetermined time unit that is longer than a maximum reproduction period of a video object unit.

12. A recording apparatus as claimed in claim 11, wherein said controller is operable to generate the first entries such that each of the first entries further includes difference information indicating a difference between a corresponding one of the reproduction points and a reproduction start time of the respective video object unit.

13. A recording apparatus as claimed in claim 10, wherein said controller is further operable to generate time map information which includes the number of first entries in each first time table and the number of second entries in each second time table, and said writing device is further operable to write the time map information onto the optical disc.

14. A recording apparatus as claimed in claim 9, wherein said controller is operable to generate the first entries such that the first entries indicate storage positions of video object units corresponding to reproduction points that differ by a predetermined time unit that is longer than a maximum reproduction period of a video object unit.

15. A recording apparatus as claimed in claim 14, wherein said controller is operable to generate the first entries such that each of the first entries further includes difference information indicating a difference between a corresponding one of the reproduction points and a reproduction start time of the video object unit.

16. A recording apparatus as claimed in claim 9, wherein said controller is further operable to generate time map information which includes the number of first entries in the first time table and the number of second entries in the second time table, and said writing device is further operable to write the time map information onto the optical disc.

* * * * *